US007087507B2

(12) United States Patent
Koldiaev et al.

(10) Patent No.: US 7,087,507 B2
(45) Date of Patent: Aug. 8, 2006

(54) IMPLANTATION OF DEUTERIUM IN MOS AND DRAM DEVICES

(75) Inventors: Viktor Koldiaev, San Jose, CA (US); Jeff Babock, Sunnyvale, CA (US); George Cheroff, Oakland, CA (US)

(73) Assignee: PDF Solutions, Inc., San Jose, CA (US)

( * ) Notice: Subject to any disclaimer, the term of this patent is extended or adjusted under 35 U.S.C. 154(b) by 59 days.

(21) Appl. No.: 10/847,538

(22) Filed: May 17, 2004

(65) Prior Publication Data

US 2005/0255684 A1    Nov. 17, 2005

(51) Int. Cl.
H01L 21/425    (2006.01)
(52) U.S. Cl. ...................... 438/528; 438/530
(58) Field of Classification Search ................ 438/528, 438/530
See application file for complete search history.

(56) References Cited

U.S. PATENT DOCUMENTS

| | | | |
|---|---|---|---|
| 5,872,387 A | | 2/1999 | Lyding et al. |
| 5,972,765 A | * | 10/1999 | Clark et al. .................. 438/308 |
| 6,114,734 A | | 9/2000 | Eklund |
| 6,143,632 A | * | 11/2000 | Ishida et al. ................. 438/543 |
| 6,147,014 A | * | 11/2000 | Lyding et al. ............... 438/798 |
| 6,943,126 B1 | * | 9/2005 | Narayanan et al. .......... 438/784 |
| 2002/0031920 A1 | * | 3/2002 | Lyding et al. ............... 438/795 |
| 2002/0168841 A1 | * | 11/2002 | Chetlur et al. .............. 438/585 |
| 2003/0219950 A1 | * | 11/2003 | Lyding et al. ............... 438/301 |

FOREIGN PATENT DOCUMENTS

| | | |
|---|---|---|
| WO | WO-94/19829 | 9/1994 |
| WO | WO-97/26676 | 7/1997 |

OTHER PUBLICATIONS

J.W. Lyding, K. Hess, and I.C. Kizilyalli, "Reduction of Hot Electron Degradation in Metal Oxide Semiconductor Transistors by Deuterium Processing," vol. 68, No. 18, *Appl. Phys. Lett.*, pp. 2526-2528, 1996.

W.F. Clark, T.G. Ference, S.W. Millt, J.S. Burnham, and E.D. Adams, "Improved Hot Electron Reliability High-Performance, Multi-Metal CMOS Using Deuterated Barrier-Nitride Processing," *IEEE Electron Device Lett.*, vol. EDL-20, No. 10, pp. 501-503, 1998.

(Continued)

*Primary Examiner*—Alexander Ghyka
(74) *Attorney, Agent, or Firm*—Steptoe & Johnson LLP; Tyson Y. Winarski

(57) ABSTRACT

A structure and method passivates dangling silicon bonds by the introduction of deuterium into a Metal Oxide Semiconductor Field Effect Transistor (MOSFET) by ion implantation. The process of implantation provides precise placement of deuterium at optimum locations within the gate stack to create stable silicon-deuterium bond terminations at the $Si-SiO_2$ interface within the gate-channel region. The deuterium is encapsulated in the MOSFET by the use of a Silicon Nitride (SiN) barrier mask. The ability of deuterium to passivate dangling silicon bonds is maximized by removing hydrogen present in the MOSFET and by use of an absorption layer to create a deuterium rich region.

25 Claims, 17 Drawing Sheets

OTHER PUBLICATIONS

I.C. Kizilyalli, et al., "Multi-Level Metal CMOS Manufacturing with Deuterium for Improved Hot Carrier Reliability," *IEDM Tech. Dig.*, pp. 935-937, 1988.

W.F. Clark, P.E. Cottrell, T.G. Ference, S.-H. Lo, J.G. Massey, S.W. Millt, and J.H. Rankin, "Channel Hot Electron and Hot-Hole Improvement in A1 and Cu Multilevel Metal CMOS Using Deuterated Anneals and Passivating Films," *IEDM Tech. Dig.*, pp. 1999.

I.C. Kizilyalli, J.W. Lyding and K. Hess, "Deuterium Post-Metal Annealing of MOSFET's for Improved Hot Carrier Reliability," *IEEE Electron Device Lett.*, vol. EDL-18, No. 3, pp. 81-83, 1997.

J. Lee, et al., "The Effect of Deuterium Passivation at Different Steps of CMOS Processing on Lifetime Improvements of CMOS Transistors," *IEEE Trans. Electron Devices*, vol. ED-46, No. 8, pp. 1812-1813, 1999.

S. Wolf and R.N. Tauber, "Silicon Processing for the VLSI Era," vol. 1-3, *Lattice Press*, 1986-1995.

K. Saadatmand, E. McIntyre, S. Roberge, W. Zhimin, K. Wenzel, R. Rathmell, and J. Dykstra, "Radiation emission for ion implanters when implanting hydrogen and deuterium," *International Conference on Ion Implantation Technology Proceedings*, Edited by J. Matsuo, G. Takaoka, and I. Yamada, vol. 1, pp. 292-295, 1998.

D. Misra and R.K. Jarwal, "Reliability of Thin Oxides Grown on Deuterium Implanted Silicon Substrates," *IEEE Trans. Electron Devices*, vol. ED-48, No. 5, pp. 1015-1015, 20001.

K. Cheng, K. Hess, and J. W. Lyding, "Deuterium Passivation of Interface Traps in MOS Devices," *IEEE Electron Device Lett.*, vol. EDL-22, No. 9 pp. 441-443, 2001.

P. J. Chen and R. M. Wallace, "Deuterium Transport Through Device Structures," *Journal of Applied Physics*, vol. 86, No. 4, pp. 2237-2244, 1999.

B.J. O'Sullivan, P.K, Hurley, C. Leveugle and J. H. Das, "Si(100)-$SiO_2$ Interface Properties Following Rapid Thermal Processing," *Journal of Applied Physics*, vol. 89, No. 7, pp. 3811-3820, 2001.

P.K. Hurley, B.J. O'Sullivan, F.N. Cubaynes, P.A. Stolk, F.P. Widershoven and J. H. Das, "Examination of Si(111)-$SiO_2$, Si(110)-$SiO_2$ Interfacial Properties Following Rapid Thermal Annealing," *Journal of Electrochemical Society*, vol. 149, No. 3, pp. G194-G197, 2002.

* cited by examiner

IMPLANTATION OF DEUTERIUM IN MOS AND DRAM DEVICES

FIELD OF THE INVENTION

The present invention relates to the field of semiconductor devices, and in particular to the use of deuterium to enhance the performance and reliability of semiconductor devices.

BACKGROUND OF THE INVENTION

New solutions for addressing the non-idealities present in semiconductor devices allows for continued reductions in scale and increases in performance. One of these non-idealities is interfacial traps, also referred to as surface states or interface states. Interfacial traps have wide-ranging and degrading effects upon the operational behavior of Metal-Oxide-Semiconductor (MOS) devices. Interfacial traps are allowed energy states in which electrons are localized in the vicinity of a material's surface. Interfacial traps primarily arise from unsatisfied chemical bonds that occur at the semiconductor-oxide interface. When a silicon lattice is abruptly terminated along a given plane to form a surface, one of the four surface-atom bonds is left dangling. The thermal formation of an $SiO_2$ layer over the silicon substrate ties up some, but not all of the bonds present at the silicon surface. It is these unsatisfied chemical bonds, referred to as dangling bonds, that become interfacial traps.

Interfacial traps charge and discharge as a function of bias, thereby affecting the charge transport characteristics in a semiconductor device. As a result, interfacial traps produce instabilities in the operation of MOS devices through causing shifts in the threshold voltage and reduction in the channel conductance. When present in a significant concentration, interfacial traps are detected, for example, in the spread out the Capacitance-Voltage (C-V) curve measurement of an MOS device.

Hydrogen passivation is a common technique to minimize the presence of dangling bonds present at the $SiO_2$—Si interface. Low-temperature, post-metal annealing in a hydrogen ambient is widely used in MOS fabrication to form SiH bonds with the silicon dangling bonds, thereby passivating them. However, these SiH bonds are not stable, and can be broken by highly energetic carriers (hot carriers) moving in the channel. The bond breaking process is referred to as de-passivation or desorption.

Hot carriers are energetic charge carriers that undergo ballistic transport across the channel between the source and drain. While traversing the channel between the source and drain, the population of hot carriers experience few, if any scattering events allowing for these carriers to achieve a velocity considerably higher than the normal distribution. The continued reduction in the scale of MOS devices leads to channel lengths of such short distance that the resulting increase in the population of hot carriers significantly magnifies the severity of the problem.

The deleterious effects of hot carriers is referred to as hot carrier degradation, (HCD). HCD is a particulary important reliability issue, given the desire to scale devices to extremely small dimensions. HCD results from heating and subsequent injection of carriers into the gate oxide or the Si substrate, causing a localized and nonuniform buildup of interface states and oxide charges near the drain junction of the MOS transistor. In addition, the generation of such interface and oxide defect states are in general accompanied by threshold shifts. The threshold voltage shifts lead to another phenomenon referred to as negative bias temperature instability (NBTI). Such reliability degradation phenomenom are frequently accompanied by mobility degradation, as exhibited by reduced transconductance and drain current. These effects are in general exponentially accerlated with increasing temperature.

The hydrogen-silicon bonds that are created by the hydrogen passivation processes to militate against defects formed at the Si—SiO2 interface, can be broken by hot carrier interactions, allowing for the release of the passivated defects that manifest themselves in a host of reliability and device performance problems. In addition, with desorption of the Si—H bond, the release of H can be involved in the further degradation of device reliability. For example, it is known that HCD and NBTI effects are always accompanied by the generation of positive charge into the gate oxide (SiO2), close to the Si—SiO2 interface. It is believed that this effect can be explained by the release of hydrogen and its incorporation, (positive charge), into the gate oxide layer as a result of the breaking of the Si—H bonds by the action of highly energetic carriers.

Deuterium (D) provides an improved way for stabilizing dangling silicon bonds. The Si-D bonding configuration has three distinguishable and highly favorable features when compared to the Si—H configuration with regard to bond stability and the relative equilibrium concentrations of the two species.

(1) The higher mass from the deuterium atom results in a lower diffusion coefficient than hydrogen. The lower diffusion constant of deuterium increases the rate of bond formation with silicon at the interface due to its longer residence time, i.e a factor in the rate of D bonding is determined by the rate at which D2 moves away from the surface. This is the case for the rate determining (non-equilibrium) part of the process. In simple terms, the D bonding rate is equal to the arrival rate of D atoms minus the outflow rate controlled by diffusion. A kinetic model might assume that the bonding rate is propotional to the number of dangling bonds available at any time t, i.e an exponential (decreasing) time dependence of the number of bonds created.

(2) The equilibrium concentration of Si-D, is found to be more than an order of magnitude higher than Si—H, and is related to both the ratio of the effective masses and their respective vibrational frequencies.

(3) It has been demonstrated both experimentally and theoretically that the Si-D bonds are significantly more stable than the Si—H bonds. The effect follows from the difference of the lattice dynamical behavior of isotopes and is referred to as the "giant isotope effect". Current theories propose to explain this remarkable isotope effect, i.e., the Si-D bond is more resistant to hot-electron excitation than the Si—H bond as well as the order magnitude higher equilibrium concentration in Si, compared to that of hydrogen. The Si—H/D bond breaking at the SiO2/Si interface is caused by two competing processes. One is that the energy of the bonds is accumulated through excitation by energetic hot electrons. The other process is de-excitation, where the bond energy is taken away by coupling between the Si—H/D vibrational modes and substrate phonons. Van de Walle and Jackson suggested that the vibrational frequency of Si-D bending mode is close to the Si—Si TO phonon mode, resulting in energy coupling between the Si-D bending mode and the Si—Si TO phonon mode. This deexcitation effectively strengthens the Si-D bond. On the other hand, because the vibrational frequency of the Si—H bond is far away from the Si—Si TO phonon mode, there is no energy coupling between the Si—H bending mode and the Si—Si TO phonon mode, leading to Si—H bonds more vulnerable to hot-electron excitation.

Therefore, the larger equilibrium population of surface dangling bonds exhibited by deuterium as compared to hydrogen, in addition to their higher stability, provides significant improvements for the passivation process.

Finally, experimental evidence shows that the slight increase in bonding energy of the Si-D bonds is not the primary mechanism that provides higher stability over the Si—H bonds. It has been shown, for example, that the desorption of both Si—H and Si-D bonds can occur at carrier energies significantly lower than that predicted by a bonding threshold mechanism. Thus, the other factors described above, in particular the differences between the local vibration characteristics and their coupling to the silicon lattice phonons, dominate their desorption properties.

For the purpose of achieving the maximum concentration Si-D bonds for effective passivation, the presence of existing H commonly introduced by CMOS processing steps must also be considered. It has been shown that D is able to displace a considerable fraction of the existing H present for the case of optimal annealing temperatures. However, it has also been shown that re-exposure to D can still increase the concentration of D.

There is also a deleterious effect brought about by H or D passivation that must be considered. In the case where a MOSFET device receives a blanket passivation of H or D, i.e. the source drain areas in addition to the channel regions, it is known that both species can "passivate" the dopant atoms. In this case the dopant atoms become electrically neutral, increasing the series resistance of the source drain areas. This parasitic resistance effect degrades the device performance and manifests itself in lower drive currents with concomitant poorer performance.

There is another manifestation of the blanket method to introduce hydrogen (or deuterium) into the Si—SiO2 interface. The existing methods to introduce either hydrogen or deuterium into the channel interface towards the end of the device fabrication steps requires that either passivation species must diffuse through a number of film layers. In actual experience, some success has been achieved with the introduction of hydrogen by this method. However much less success has been experienced in the case for the blanket introduction of deuterium. One interpretation of these results from the experimental evidence is that the passivation by hydrogen is achieved from internal sources of hydrogen, e.g. poly-Si during the annealing processes. Then the failure of the blanket deuterium annealing processes can be explained by the fact that deuterium cannot diffuse through the multi film layers in the gate stack, as in the case for hydrogen, but in this case there is no internal source of deuterium. It is therefore highly desirable to develop new MOS manufacturing processes that efficiently incorporate the selective introduction of deuterium into the interface region that is stabilized within the channel of MOSFET devices.

SUMMARY OF THE INVENTION

The present invention provides a novel method for passivating dangling silicon bonds through the selective use of deuterium. More particularly, the present invention provides for the selective introduction of deuterium into a gate-channel region of a Metal Oxide Semiconductor Field Effect Transistor (MOSFET), at the early stage of the device process, while keeping the source-drain regions free of deuterium. The strategic placement of deuterium into the gate-channel region that keeps the source-drain region free of deuterium enhances the performance and reliability of MOSFET devices by creating stable silicon bond terminations at the Si—SiO$_2$ interface in the gate-channel region.

BRIEF DESCRIPTION OF THE DRAWINGS

FIG. 6 illustrates a Silicon Nitride sealing layer mask deposited on a MOSFET.

FIG. 7 illustrates a MOSFET having SOG, BPSG, or Spin-On-Glass formed over a Silicon Nitride barrier mask.

FIG. 8 illustrates ion implantation of deuterium into a gate stack of a MOSFET.

FIG. 9 illustrates diffusion of deuterium through a gate stack with a medium temperature anneal.

FIG. 10 illustrates formation of contacts in a MOSFET having dangling bonds passivate by deuterium in the gate-channel region.

FIG. 11 illustrates a completed MOSFET structure having two layers of metallization.

DETAILED DESCRIPTION OF THE PREFERRED EMBODIMENTS

Figure 1:
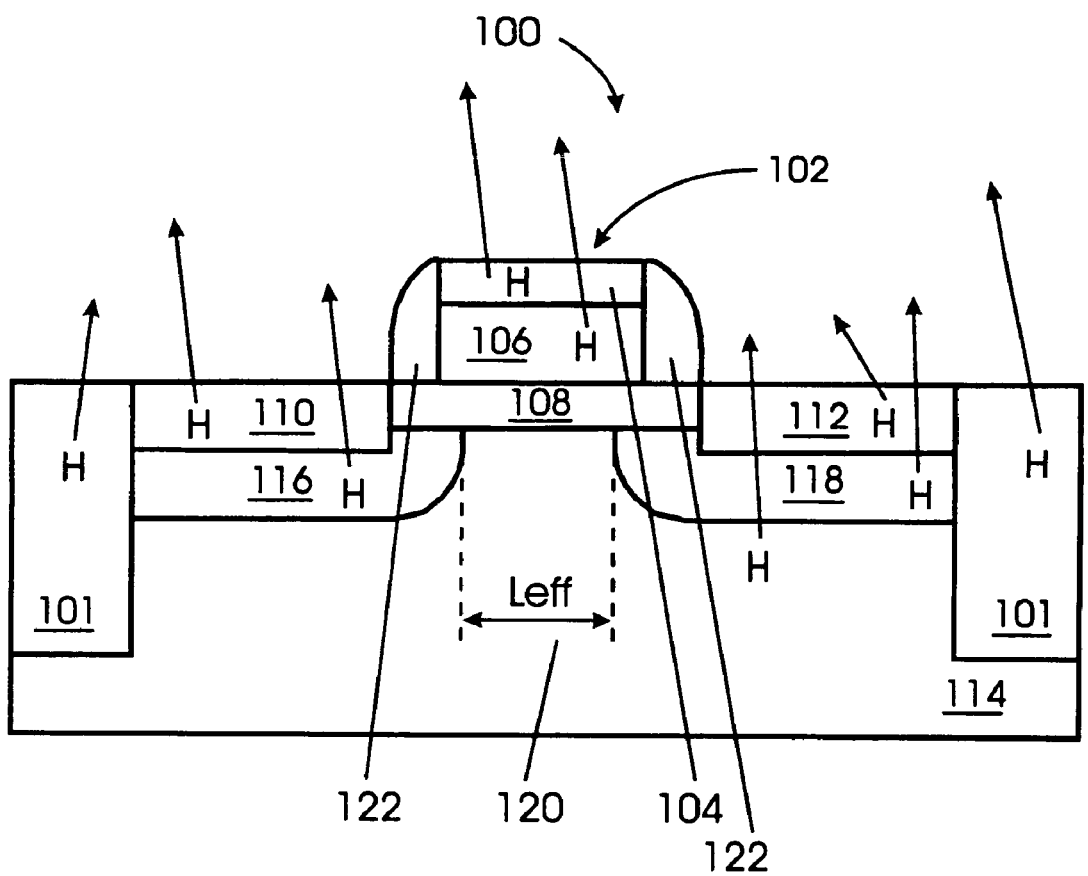
FIG. 1 illustrates a Thermal Anneal (TA) to drive off hydrogen from a MOSFET.

Referring to the Figures by characters of reference, FIG. 1 illustrates a Metal Oxide Semiconductor Field Effect Transistor (MOSFET) structure at the process stage where the formation of the spacer 122 has been completed. Shallow Trench Isolation (STI) 101 is used to isolate MOSFET 100 from other devices. STI 101 is typically composed of a dielectric material, such as SiO$_2$. MOSFET 100 is formed having a gate stack 102 that includes a gate silicide 104, a poly-silicon gate 106, and a gate dielectric 108. Heavily doped source-drain regions 110 and 112 are formed in substrate 114 adjacent to gate stack 102. Lightly doped source-drain regions 116 and 118 are illustrated below source-drain regions 110 and 112. Between source-drain regions 110 and 112 lies channel 120 formed by applying a voltage across gate stack 102. An exemplary material for substrate 114 is silicon. An exemplary material for gate dielectric 108 is $SiO_2$. Other materials for substrate 114 and gate dielectric 108 are known.

MOSFET 100 is a Lightly Doped Drain (LDD MOSFET). The LDD MOSFET is configured to minimize hot carrier effects, such as Hot Carrier Injection (HCI). HCI is a phenomenon whereby energetic electrons traverse channel 120 between heavily doped source region 110 and drain region 112 while experiencing few, if any, scattering events in channel 120. As a result of this ballistic transport, these "hot" electrons become injected into gate dielectric 108 in gate stack 102. In order to minimize the occurrence of "hot" electrons, MOSFET 100 is provided with LDD regions 116 and 118 adjacent to source-drain regions 110 and 112. LDD regions 116 and 118 lower the electric field in the vicinity of drain 112 and shift the position of the peak electric field toward the end of channel 120. Carrier injection into gate dielectric 108 is thereby reduced. LDD regions 116 and 118 are formed through the use of spacer oxides 122. HCI becomes a particular problem as the scale of MOSFET 100 is reduced. Reducing the scale of MOSFET 100 shrinks the size of channel 120, thereby increasing the occurrence of HCI.

Dangling silicon bonds are present at the interface between substrate 114 and gate dielectric 108 in the region of channel 120. The abrupt termination of substrate 114 along a plane to form the top surface of substrate 114 creates these dangling silicon bonds. Dangling silicon bonds are one of the four silicon surface-atom bonds that are left dangling and unbound to any other atom. Thermal formation of $SiO_2$ to create gate dielectric 108 ties up many, but not all of these dangling silicon bonds. These dangling silicon bonds are interfacial traps that degrade the performance of MOSFET 100. Interfacial traps charge and discharge as a function of bias, thereby affecting the charge distribution inside MOSFET 100. As a result, interfacial traps produce instabilities in the operation of MOSFET 100 by causing shifts in the threshold voltage and reduction in channel 120 conductance. When present in a significant concentration, interfacial traps can be detected, and their magnitude can be estimated, for example, by measuring spread out the Capacitance-Voltage (C-V) curve of a MOSFET device 100. Dangling silicon bonds significantly degrade the operation of MOSFET 100.

The present invention provides a novel method to passivate these dangling silicon bonds present at the Si—$SiO_2$ interface between gate dielectric 108 and substrate 114 in the region of channel 120, thereby enhancing the performance and reliability of MOSFET 100. The present invention enhances the performance of MOSFET devices with a selective and strategic introduction of deuterium into gate-channel region 102/120, while avoiding the introduction of deuterium into source-drain regions 110 and 112. The present invention passivates these dangling silicon bonds with deuterium using a number of methods including, but not limited to: ion implantation of deuterium, exposure to a deuterium gaseous or plasma environment, and the use of solid state materials impregnated with deuterium.

Deuterium is a stable isotope of hydrogen. The nucleus of deuterium, called a deuteron, has one proton and one neutron, whereas a normal hydrogen nucleus has just one proton. Deuterium is also referred to as heavy hydrogen. While not an element in its own right, atomic deuterium is referred to by the symbol D, or the gaseous species is referred to as D2. Deuterium forms a strong chemical bond with silicon. The chemical bond between deuterium and silicon is more stable than the bond formed between hydrogen and silicon.

The use of deuterium to passivate the dangling silicon bonds enhances the performance and reliability of MOSFET 100. Hot carriers traversing along the channel 120, or through the oxide 108, are capable of breaking the chemical bond between hydrogen and silicon. As a result, hot carriers can depassivate MOSFETs that are passivated with hydrogen. However, the deuterium-silicon chemical bond is more stable than the hydrogen-silicon bond. The stability of the deuterium-silicon bond that results from the coupling of the deuterium vibrational states with the Si lattice vibrational modes enables dangling silicon bonds passivated with deuterium to resist impacts from hot carriers. In addition, the vibrational states of deuterium coupled with its higher mass allows for an equilibrium concentration that is an order of magnitude higher than that of hydrogen. As a result, the utilization of deuterium to passivate the dangling silicon bonds present in substrate 114 very effectively hardens MOSFET 100 to hot carrier effects.

In addition to hardening MOSFET 100 to hot carrier effects, passivation with deuterium improves the performance and reliability of MOSFET 100 with regard to Negative Bias Temperature Instabilities (NBTI), Positive Bias Temperature Instabilities (PBTI), and Time Dependent Dielectric Breakdown (TDDB).

Passivation of the dangling bonds with deuterium not only improves device reliability, but also improves the analog performance of MOSFET 100. This improvement of analog performance is achieved through minimizing recombination in the space charge regions, minimizing 1/f noise, and improving the matching of these devices. The matching of these devices is particularly improved under asymmetric loading conditions that causes different amounts of NBTI (p-MOSFET) and PBTI (n-MOSFET) degradation to occur in the matched devices.

While the introduction of deuterium into the gate-channel region can improve device performance and reliability, the introduction of deuterium (or hydrogen) into the source-drain regions can degrade the operation of the MOSFET. An example of the degradation of the MOSFET device with the introduction of deuterium into the source-drain region is the well-known effect of the deactivation of Boron in the p-channel device. This effect manifests itself in the degradation of the Ion current. Implementation of the present invention enhances the performance and reliability of MOSFET devices by selectively and strategically creating stable silicon-deuterium bonds terminations at the Si—$SiO_2$ interface in the gate-channel region, while avoiding the introduction of deuterium into the source-drain regions. In addition, deuterium, when present in the source-drain regions 110 and 112, also causes increased junction leakage and various other device degradation phenomena.

The present invention maximizes the ability of deuterium to passivate dangling silicon bonds present in the gate-channel region by first removing the hydrogen present in all areas of the MOSFET before the various methods to selectively introduce deuterium, utilized by this invention, are applied. MOSFET process steps, e.g. poly-Si and Si3N4 depositions, introduce significant amounts of H. This step provides for the maximum incorporation of the stable species of deuterium into the gate channel area while eliminating the deleterious effects of hydrogen in the source-drain region.

Another method that the present invention maximizes the ability of deuterium to passivate dangling silicon bonds present in the gate-channel region is by introducing deuterium at an early stage of the device process. Deuterium cannot readily diffuse through the multiple layers of materials that are formed over MOS 100 during back end of the line processing. Introducing deuterium into MOS 100 prior to the back end of the line processing increases the ability of deuterium to reach the Si—SiO$_2$ where it can interact with dangling silicon bonds and thereby create stable silicon bond terminations at the Si—SiO$_2$ interface in the gate-channel region.

The invention utilizes a variety of methods to provide precise placement of deuterium at optimum locations within desired areas of the MOSFET. These desired areas of the MOSFET include, but are not limited to, the gate stack above the channel and the region within the channel. These methods of strategically and selectively introducing deuterium into the gate-channel region, while avoiding the source-drain region, include, but are not limited to ion implantation of deuterium, exposure to a deuterium gaseous or plasma environments, and the use of solid state materials impregnated with deuterium. Such methods can include the utilization of an absorption layer to create a deuterium rich region that functions as a source for passivating the dangling silicon bonds. Another alternate embodiment of the present invention uses an ambient D2 gas environment to selectively incorporate deuterium into the MOSFET device. A further embodiment of the present invention uses deuterated silane and ammonium in the CVD type deposition of Silicon Nitride to affect a Silicon Nitride barrier mask as a rich source of deuterium. In addition, the use of deuterated silane can be used for the deposition of deuterium-impregnated poly-Si.

The present invention also utilizes a Silicon Nitride (SiN) barrier mask to encapsulate the deuterium in the MOSFET, thereby stabilizing the deuterium bonds during subsequent thermal cycling processes. Thermal cycling processes that occur after introduction of the deuterium can break the silicon deuterium bonds and cause the deuterium to diffuse out of the MOSFET. This process of breaking the silicon-deuterium bonds and causing deuterium to diffuse out of the MOSFET is referred to as depassivation. The diffusion constant of deuterium in SiN is small, thus deuterium cannot readily diffuse through a sufficiently thick SiN layer during subsequent thermal processing. As a result, the present invention protects the MOSFET against the ill effects from the loss of deuterium and the resulting depassivation during subsequent thermal processes by encapsulating the MOSFET with the SiN barrier or sealing layer. The sealing layer also prevents contamination from subsequent back end of the line processes (BEOL).

SiN encapsulation also protects the silicon-deuterium bonds against hydrogen in-diffusion. During subsequent processes, MOSFET 100 can become exposed to hydrogen. This hydrogen could diffuse into MOSFET 100 and occupy a dangling silicon bond that would otherwise be occupied by deuterium, thereby degrading the deuterium passivation. The SiN encapsulation functions as a barrier to hydrogen in-diffusion. As with deuterium, hydrogen has a small diffusion constant through SiN, thereby making SiN an effective barrier to hydrogen in-diffusion. As a result of SiN encapsulation, the hydrogen that is present in subsequent processes is unable to diffuse into MOSFET 100 where it could occupy dangling silicon bonds, thereby protecting the more desirable deuterium-silicon bonds. In addition, such SiN encapsulation can also prevent the introduction of hydrogen present in subsequent processes into the source drain regions, thus preventing the dopant deactivation effects known to be caused by hydrogen.

Referring again to FIG. 1, FIG. 1 illustrates a Thermal Anneal (TA) to drive off hydrogen from a MOSFET. The first step toward passivating dangling silicon bonds with deuterium is the removal of hydrogen from MOSFET 100. The removal of hydrogen from MOSFET 100 is particularly desirable toward forming passivated deuterium-silicon bonds. The equilibrium concentration of Deuterium is much larger than hydrogen, and forms a more stable chemical bond with silicon than hydrogen. While hot carriers can break the less stable hydrogen-silicon bonds, hot carriers are generally less able to break the more stable deuterium-silicon bonds. The performance and reliability of MOSFET 100 is therefore improved by maximizing the number of dangling silicon bonds passivated with deuterium and minimizing the number of dangling bonds passivated with hydrogen. In addition, removing hydrogen from the source drain areas 110 and 112 reduces the problem of Boron passivation in the source drain regions of a p-MOSFET device during processing, which is enhanced by the presence of hydrogen. Boron passivation is phenomena, similar to the passivation of Si dangling bonds, whereby acceptors in the source drain regions 10 and 112 are deactivated by hydrogen, or in a similar manner by deuterium, thereby increasing the series resistance of the source drain regions 110 and 112. The effect of the increase in series resistance in the P-MOS negatively affects the device performance by reducing the Ion current. The presence of hydrogen within the gate channel region of n-MOSFET devices also degrades performance by deactivating donors. An additional deleterious effect of hydrogen in the source drain region of CMOS devices is the increase in the junction leakage current instability.

It is possible to minimize the existing number of silicon-hydrogen bonds present in MOSFET 100 with a thermal anneal process. The thermal anneal breaks hydrogen-silicon bonds and drives the hydrogen out of MOSFET 100 as symbolized in FIG. 1 by the letter "H" and arrows pointing out of MOSFET 100. After the thermal anneal, ideally there is little or no hydrogen left in MOSFET 100. Any residue of Si—H will likely be replaced by the more favorable Si-D configuration. As a result of the elimination of H using the thermal anneal, the number of dangling silicon bonds that are available for bonding with deuterium is maximized. Consequently, MOSFET 100 having dangling silicon bonds passivated with deuterium is more resilient to the degrading effects of hot carriers.

Hydrogen is unable to readily diffuse through silicon nitride layers of a substantial thickness. As a result, the thermal anneal that drives hydrogen out of MOSFET 100 is performed prior to the deposition of the thick Silicon Nitride barrier mask 126.

Figure 2:
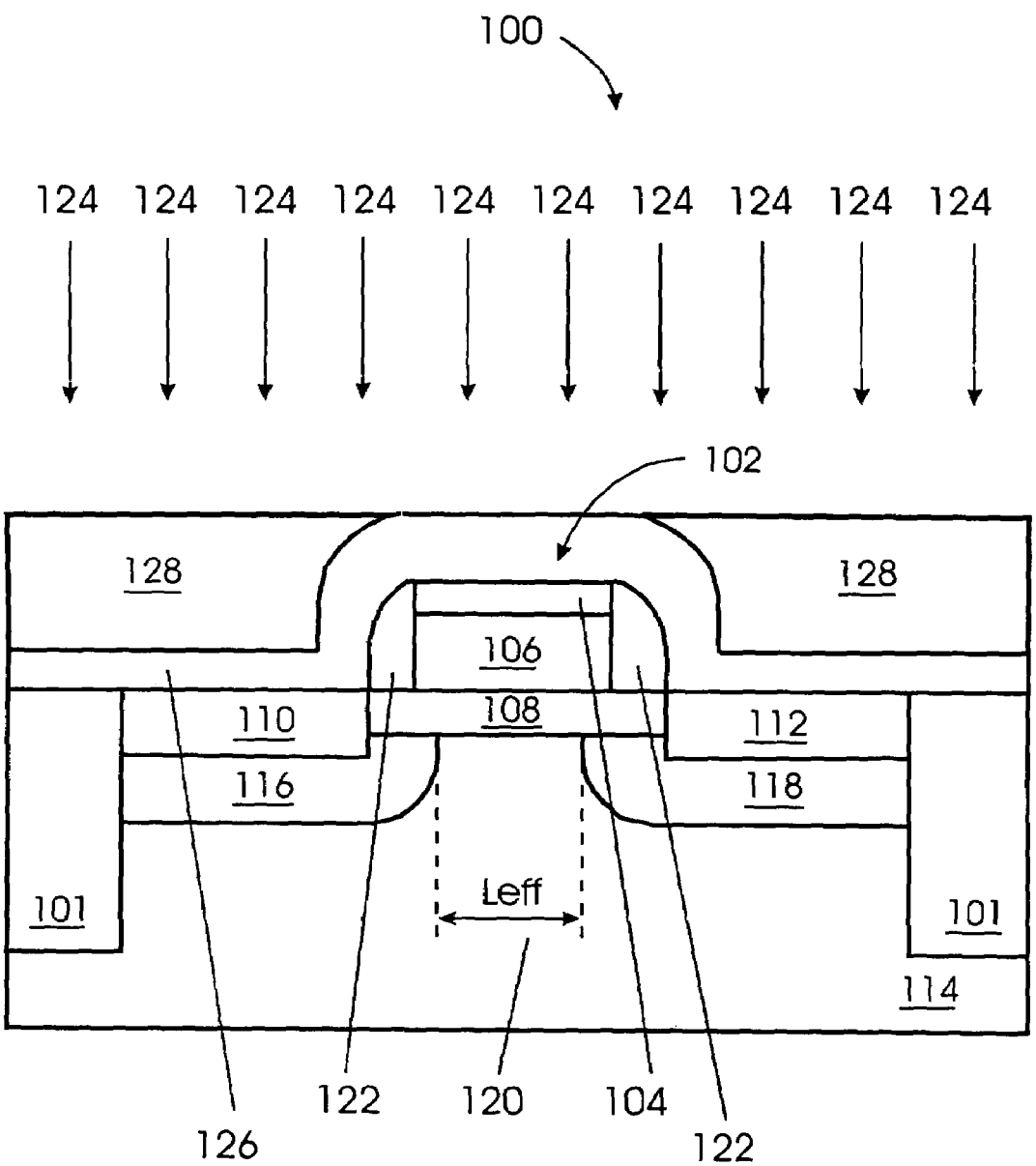
FIG. 2 illustrates the selective introduction of deuterium into a gate stack with a Silicon Nitride barrier layer and a selective deuterium mask.

FIG. 2 illustrates selective introduction of deuterium into a gate stack 106 with a Silicon Nitride layer 126 and a selective deuterium implantation mask 128. At the stage of processing illustrated in FIG. 2, MOSFET 100 has already experienced a TA as illustrated in FIG. 1 to drive out hydrogen. In a preferred embodiment, an ion implantation process 124 introduces deuterium through SiN layer 126 into MOSFET 100. A selective deuterium mask 128 is introduced onto MOSFET 100. Mask 128 is a layer of material that blocks the implantation of deuterium into source-drain regions 110 and 112. Mask 128 may be formed of a photo-resist, dielectric, or any material that is designed and selected to be a barrier against ion implantation of deuterium or gaseous plasma implantation of deuterium. A planarization process is performed on mask 128 until the top of SiN layer 126 above gate stack 102 is reached. Ion implantation process 124 implants deuterium into MOSFET 100 as well as mask 128.

It is possible to select the depth that the deuterium is implanted into MOSFET 100 through adjusting the energy of deuterium implant process 124. It is possible to implant deuterium directly into gate stack 102 where the deuterium can passivate dangling silicon bonds at the surface of substrate 114 in channel 120. Alternatively, it is possible to tune the energy of the ion implantation process 124 in order to implant the deuterium into the bottom layer of Silicon Nitride barrier mask 126. By implanting deuterium into the bottom layer of Silicon Nitride barrier mask 126, the bottom layer of Silicon Nitride barrier mask 126 is converted into a deuterium rich source. Subsequent low temperature annealing processes drive this deuterium through gate stack 102 toward substrate 114 where the deuterium passivates dangling silicon bonds in gate-channel region 102/120. Whichever energy level is selected, the level of energy used to implant deuterium into poly-silicon gate 106 is insufficient to implant deuterium all of the way through mask 128 into substrate 114. As a result, the use of mask layer 128 protects source drain regions 110 and 112 from implantation of deuterium while gate stack 102 is implanted with deuterium.

The diffusion constant of deuterium in Silicon Nitride is small. Thus, as a result, when SiN layer 126 is used as a deuterium rich source, it is required that the deuterium be placed either at or near the SiO2—Si interface 108/120 so that deuterium may diffuse into gate-stack 102. In this case where the ion implanted deuterium is placed an appropriately small distance from the interface, within the SiN layer 126, subsequent drive in processes at elevated temperatures can place the deuterium at the Si—SiO2 interface 102/120 and 108/120. Once the deuterium is placed at the Si—SiO2 interface 102/120, SiN layer 126 now acts to encapsulate the deuterium into gate stack 102 because of the low diffusion constant of deuterium in SiN. Typical thicknesses for Silicon Nitride layer 126 are approximately 100 to 1000 Å. It is possible to vary the nitride deposition composition and temperature depending upon the nitride-oxide growth requirements and the thermal budget limitations of the Complimentary MOS (CMOS) technology. Implant energies of approximately 10 keV to 25 keV are used for nitride layers, which are also called barrier masks, with thicknesses ranging from approximately 100 to 1000 Å. The prevention of the penetration of deuterium into the Si substrate of MOSFET 100 is the primary constraint on the implant energy for implantation of the deuterium. Implantation energies of less than 30 keV achieve this result. While ion implantation is a preferred method for impregnating MOSFET 100 with deuterium, other related processes such as plasma immersion ion implantation are useable.

Implantation of deuterium into poly-silicon gate 106 is followed by subsequent low thermal budget annealing processes that drive the implanted deuterium toward the dangling silicon bonds present at the Si—SiO$_2$ interface in the region of channel 120. These thermal processes are used for either of the positions where the deuterium is initially implanted, i.e. at the bottom portion of SiN layer 126, or within the Poly-Si gate layer 106. Once driven toward the dangling bonds present at the Si—SiO2 interface in the channel region of MOSFET 100, the deuterium interacts with the dangling silicon bonds, thereby passivating them. During this thermal annealing process, SiN layer 126 prevents out diffusion of deuterium from MOSFET 100.

MOSFET 100 is placed through subsequent fabrication processes after the implantation of deuterium to form complete CMOS devices that include contacts and interconnect. These subsequent processes can include thermal processes. Subsequent thermal processing of MOSFET 100 can cause the implanted deuterium to diffuse out of MOSFET 100, thereby exposing the dangling silicon bonds present in substrate 114. However, Silicon Nitride mask 126 prevents the out diffusion of deuterium from MOSFET 100, thereby stabilizing the silicon-deuterium bonds and preventing depassivation. As a result, the passivation of the dangling bonds is protected against the subsequent fabrication processes, thereby enhancing the reliability and performance of MOSFET 100.

By use of the selective deuterium implantation mask 128 and SiN layer 126, the present invention introduces deuterium into gate-channel region 102/120 of MOSFET 100 while avoiding the introduction of deuterium into source drain regions 110 and 112. The introduction of deuterium into gate-channel region 102/120 improves device reliability by passivating dangling silicon bonds. By not implanting deuterium into source-drain regions 110 and 112 and lightly doped source-drain regions 116 and 118, the present invention avoids deactivation the acceptors, (to a lesser extent donors), in the source-drain regions 110 and 112. If deactivation of the dopants in the source drain regions were to occur, the series resistance of the source drain configuration would increase, thus lowering the Ion current. In addition, by selectively and strategically implanting deuterium only into gate-channel region 102/120, the present invention avoids problems of increased junction leakage and various other device degradation phenomena caused by the presence of deuterium in source-drain regions 110 and 112.

Figure 3:
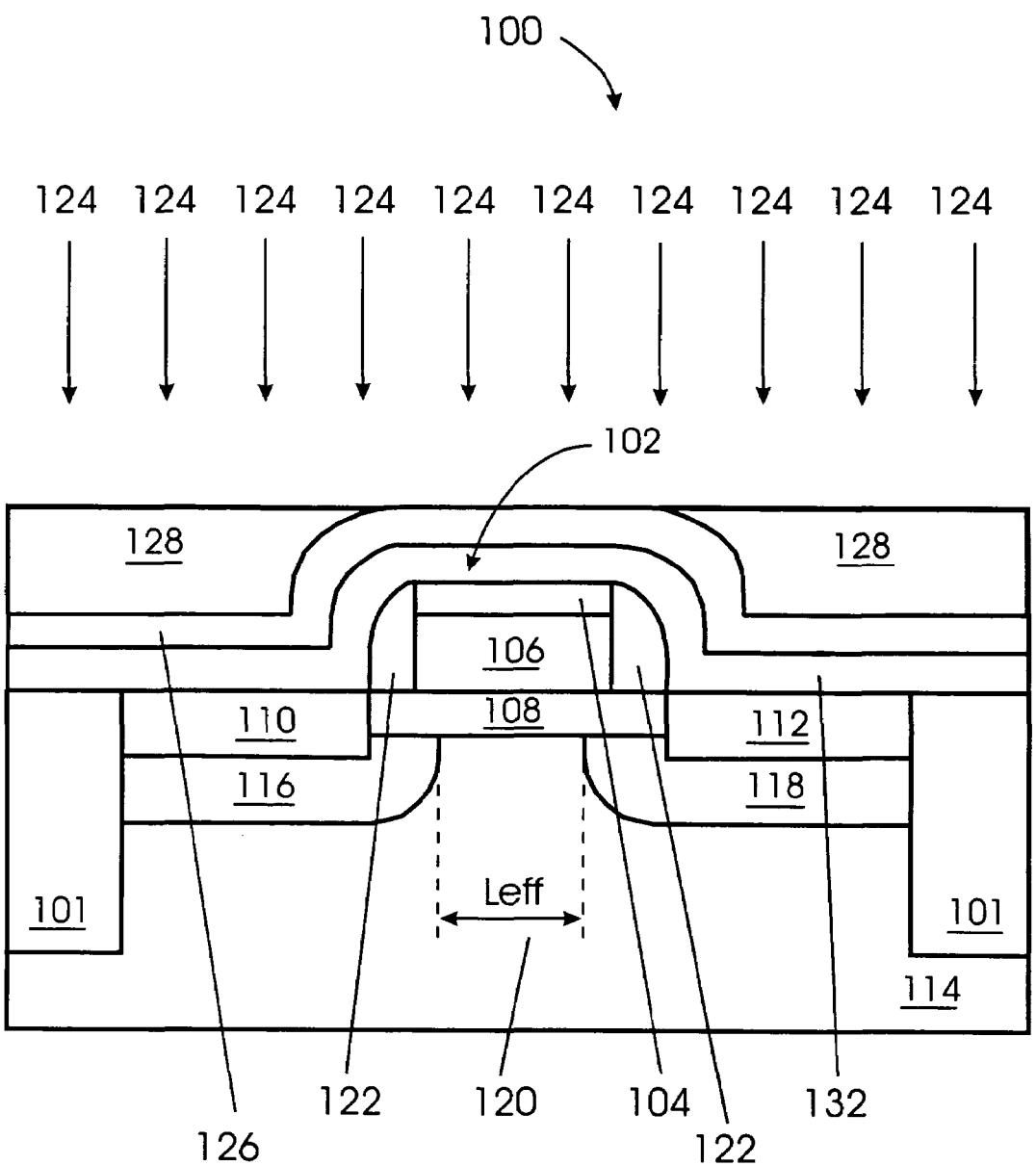
FIG. 3 illustrates the introduction of deuterium into a deuterium absorption layer formed below a Silicon Nitride barrier layer and a selective implantation mask.

FIG. 3 illustrates introduction of deuterium into a deuterium absorption layer formed below a Silicon Nitride barrier mask 126. At the stage of processing illustrated in FIG. 3, MOSFET 100 has already experienced an TA as illustrated in FIG. 1 to drive out hydrogen. A deuterium absorption layer 132 is deposited over MOSFET 100. Deuterium absorption layer 132 is formed of a material that is capable of absorbing greater concentrations of deuterium than Silicon Nitride barrier mask 126. Examples of such materials include poly-silicon and TEOS. Silicon Nitride mask 126 is then deposited over deuterium absorption layer 132.

A selective deuterium mask 128 is deposited over MOSFET 100 in order to facilitate the selective introduction of deuterium into gate stack 102. Mask 128 blocks the introduction of deuterium into source drain regions 110 and 112. Mask 128 is planarized down to the top surface of SiN layer 126 that is on top of gate stack 102.

An ion implantation process 124 is then used to implant deuterium through Silicon Nitride barrier mask 126, and into deuterium absorption layer 132. By making deuterium absorption layer 132 out of a material that absorbs greater concentrations of deuterium than Silicon Nitride barrier mask 126, it is possible to implant greater concentrations of deuterium into MOSFET 100. Implantation process 124 is performed to saturate deuterium absorption layer 132 with deuterium.

Deuterium absorption layer 132 functions as a selective deuterium rich source due to the presence of selective deuterium mask 128. Deuterium selectively implanted into deuterium absorption layer 132 passivates dangling silicon bonds present at the top surface of substrate 114 at desired regions such as gate-channel region 102/120. Low temperature thermal annealing processes that are compatible with CMOS fabrication cause deuterium to diffuse out of deuterium absorption layer 132 into substrate 114 where the deuterium pacifies dangling silicon bonds. Silicon Nitride barrier mask 126 functions as a barrier to out diffusion of deuterium from MOSFET 100 during this thermal processing.

Figure 4:
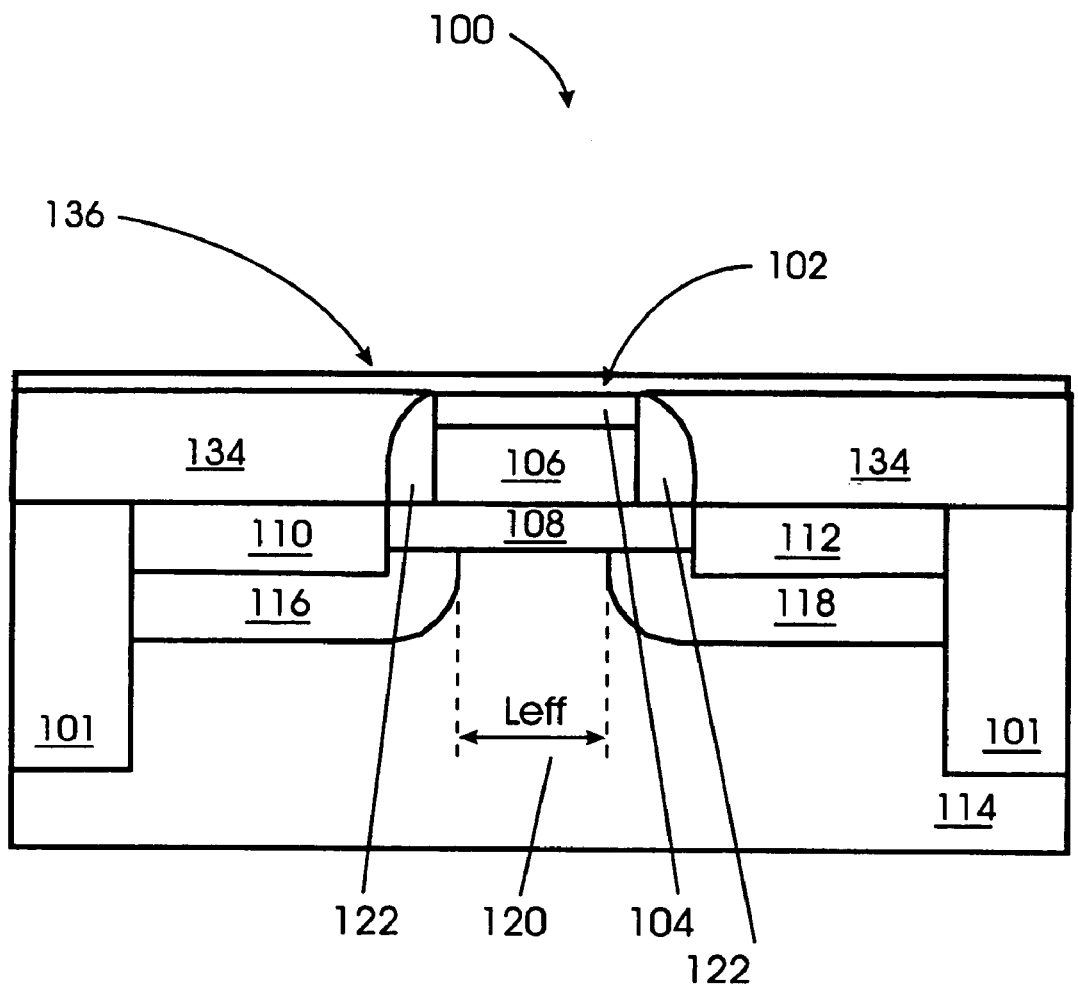
FIG. 4 illustrates a use of solid-state materials impregnated with deuterium to passivate dangling silicon bonds on a MOSFET.

FIG. 4 illustrates a use of solid-state materials impregnated with deuterium to passivate dangling silicon bonds on MOSFET 100. At the stage of processing illustrated in FIG. 4, MOSFET 100 has already experienced an RTA as illustrated in FIG. 1 to drive out hydrogen. In FIG. 4, an SiN mask 134 is deposited by conventional means over MOSFET 100. SiN mask 134 is planarized down to the top surface of gate stack 102, thereby exposing the top surface of gate stack 102. Subsequently, a layer 136 of deuterium impregnated material is deposited over MOSFET 100 on top of gate stack 102. The use of mask 134 prevents the deposition of the deuterium-impregnated material over source drain regions 110 and 112. After the deposition of layer 136 is complete, a subsequent thermal process drives the deuterium from layer 136 into the desired active regions of MOSFET 100 near gate-channel region 102/120. The diffusion constant of deuterium in SiN is small, thus deuterium cannot readily diffuse through a sufficiently thick SiN layer 134 during subsequent thermal processing.

Deuterated silane and ammonium in the CVD type deposition of SiN is one exemplary method that can affect a SiN layer 136 as a source of deuterium as described in the above example. The additional advantage of the use of deuterium for the production of SiN is related to the absence of residual hydrogen in the deposited layer at the SiN metal interface. In this case, additional deuterium can also be added, if required, by the implantation process described above. Alternatively, another exemplary method of creating layer 136 is to deposit a layer 136 without deuterium and then convert it into a deuterium rich source through an ion implantation process. Other methods of creating a SiN layer 136 impregnated with deuterium are known.

Figure 5:
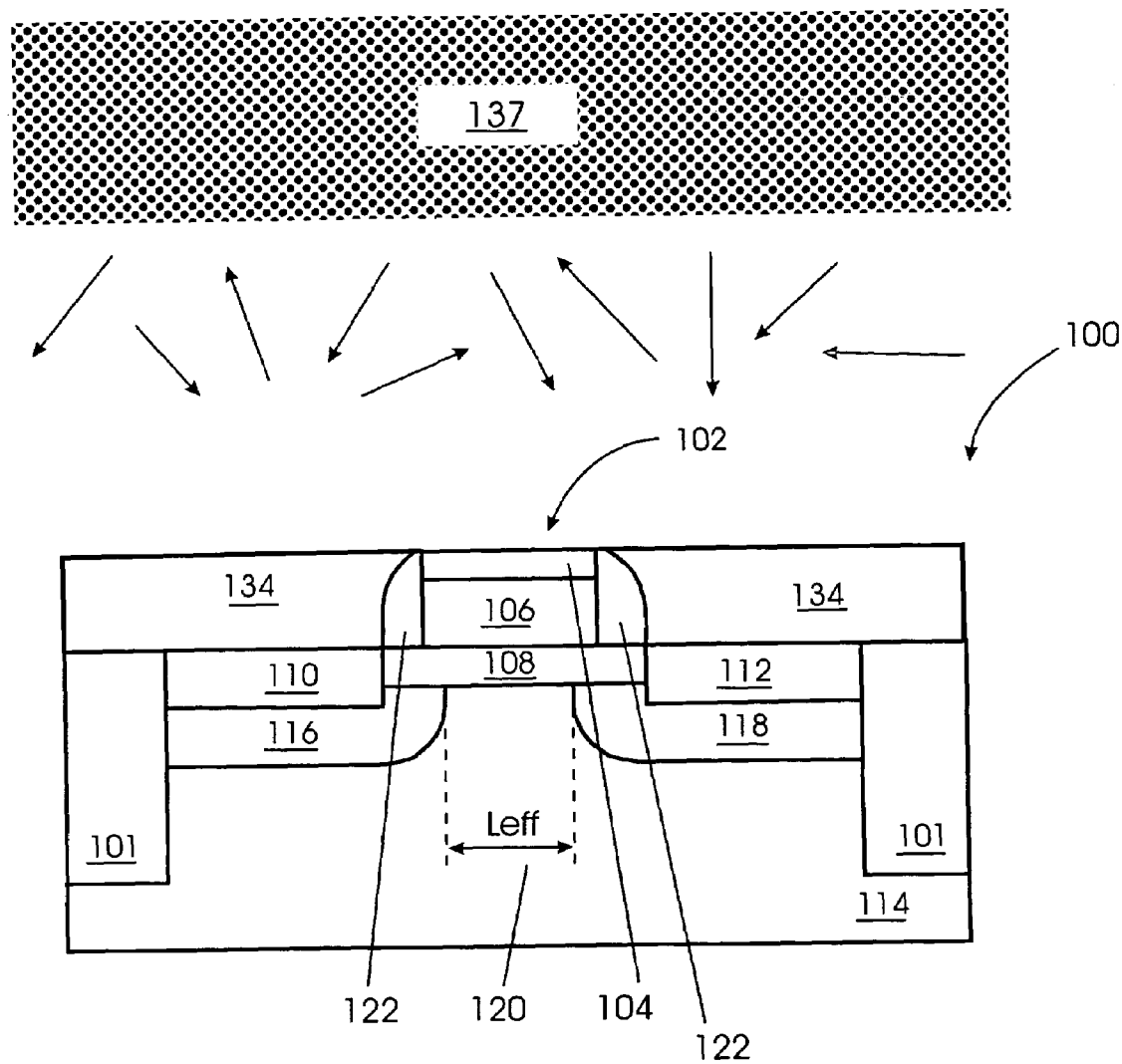
FIG. 5 illustrates selective introduction of deuterium into a gate stack with a Silicon Nitride barrier mask.

FIG. 5 illustrates selective introduction of deuterium into a gate stack with a Silicon Nitride barrier mask. At the stage of processing illustrated in FIG. 5, MOSFET 100 has already experienced an RTA as illustrated in FIG. 1 to drive out hydrogen. In FIG. 5, a Silicon Nitride mask 134 is deposited over MOSFET 100. Mask 134 is planarized down to the top surface of gate stack 102, thereby exposing the top surface of gate stack 102. MOSFET 100 is then directly exposed to a gaseous deuterium ambient or plasma 137 at an elevated temperature. Silicon Nitride mask 134 prevents the gaseous deuterium ambient 137 from diffusing into the covered source-drain regions 110 and 112 due to the fact that deuterium as a low diffusion constant in Silicon Nitride. However, deuterium is able to diffuse readily through exposed gate stack 102. An additional thermal process may then be used to drive deuterium through gate stack 102 into gate-channel region 102/120 of MOSFET 100 in order to passivate dangling silicon bonds. Consequently, by use of mask 134, it is possible to selectively introduce deuterium into gate stack 102 by means of a gaseous deuterium ambient 137 without introducing deuterium into source-drain regions 110 and 112.

Figure 6:
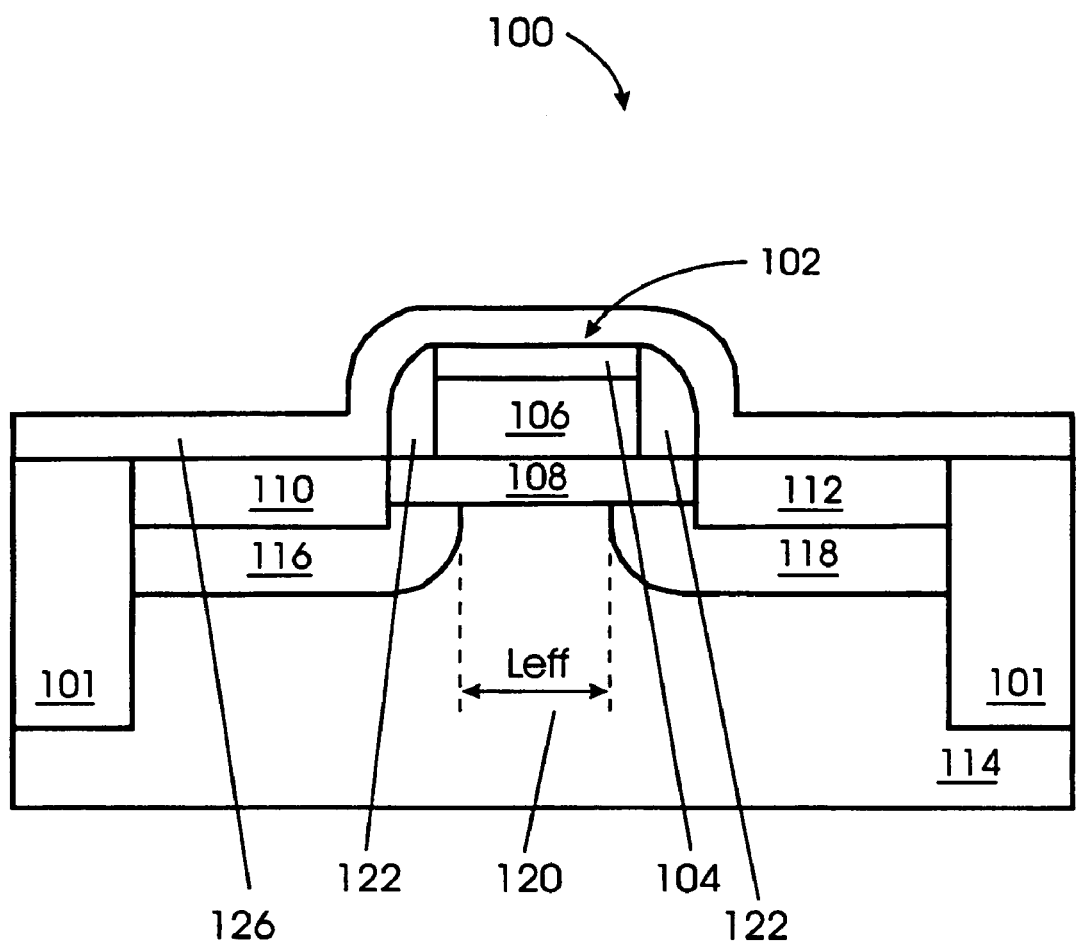
FIGS. 6–11 illustrate a process for fabricating a MOSFET having dangling silicon bonds passivate by selective implantation of deuterium facilitated by Spin-On-Glass.

FIGS. 6–11 illustrate a process for fabricating a MOSFET without the presence of hydrogen, having dangling silicon bonds selectively passivated by deuterium by use of Spin-On-Glass (SOG). FIG. 6 is typical example of a MOSFET process at a stage, which has completed the spacer and S/D diffusions. These fabrication processes may introduce hydrogen into MOSFET 100. The presence of this hydrogen can inhibit the ability of deuterium to passivate dangling silicon bonds. A low-pressure medium temperature thermal anneal process, or Rapid Thermal Anneal (RTA) is performed to drive hydrogen out of MOSFET 100 prior to the deposition of the Silicon Nitride barrier mask as illustrated in FIG. 1. It is possible to perform this medium temperature thermal anneal process in a Low Pressure Chemical Vapor Deposition (LPCVD) chamber.

FIG. 6 illustrates a Silicon Nitride barrier mask deposited on a MOSFET. MOSFET 100 is fabricated utilizing conventional process techniques. After driving hydrogen out of MOSFET 100 in the LPCVD chamber, at the process stage shown in FIG. 1, an LPCVD nitride deposition process is performed to fabricate Silicon Nitride barrier mask 126. This LPCVD nitride deposition process is performed in the same LPCVD chamber as the medium temperature thermal anneal process, or RTA. The deposition of Silicon Nitride barrier mask 126 encapsulates MOSFET 100 and inhibits hydrogen from diffusing back into MOSFET 100 at later process stages. It is desirable to fabricate Silicon Nitride barrier mask 126 utilizing LPCVD processes due to its improved properties over nitrides formed using Plasma Enhanced Chemical Vapor Deposition (PECVD). Nitrides formed using LPCVD or Remote Plasma Deposition (RPD) have superior qualities as a diffusion barrier to both hydrogen and deuterium over those formed using PECVD. Nitride-hydrogen bonds are strong in nitride layers fabricated using LPCVD processes. As a result of these strong bonds, hydrogen present in Silicon Nitride barrier mask 126 is unable to diffuse into MOSFET 100 so long as Silicon Nitride barrier mask 126 does not experience temperatures greater than 650 degrees Celsius.

Figure 7:
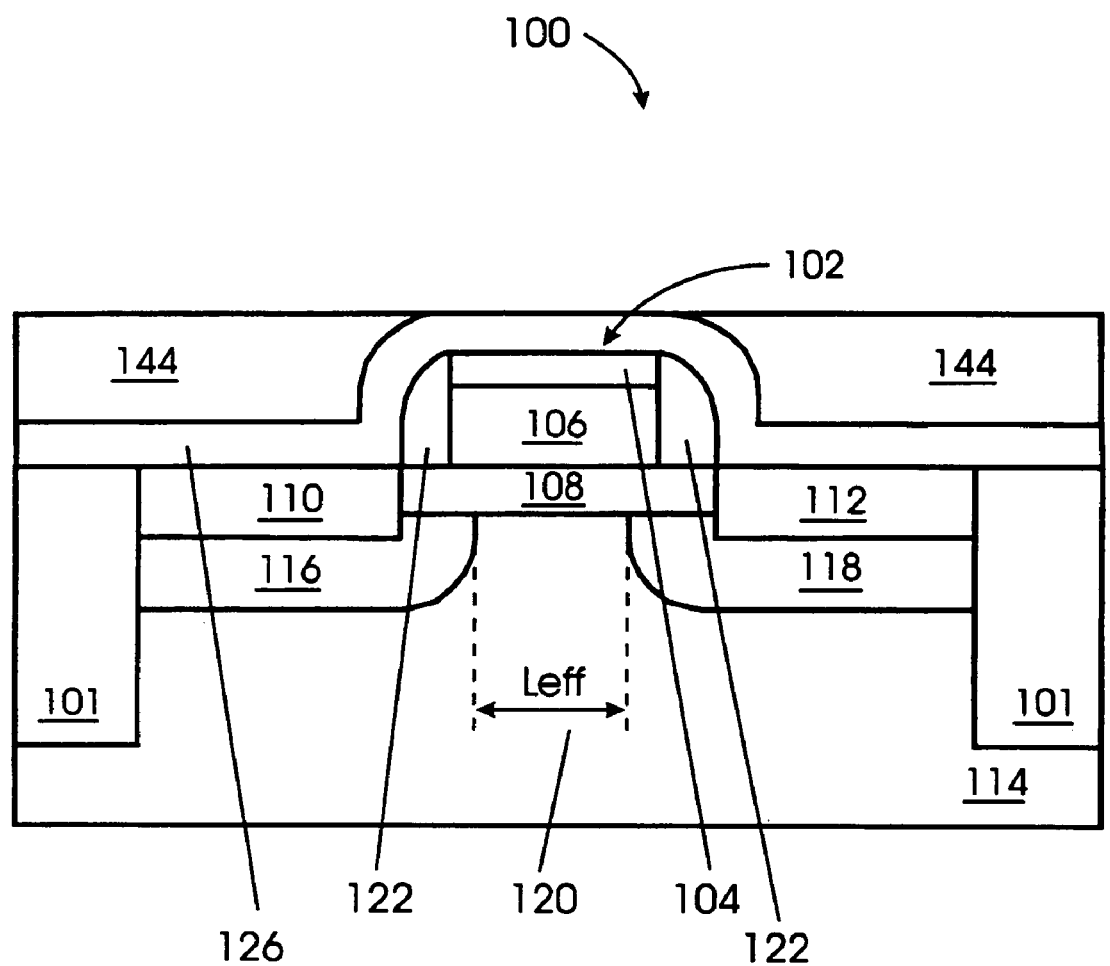

FIG. 7 illustrates a MOSFET having SOG, BPSG, or other similar materials that are amenable to planarization using a CMP type process, formed over a Silicon Nitride barrier mask. A planarization layer 144 is deposited over MOSFET 100 subsequent to fabrication of Silicon Nitride barrier mask 126. It is possible to form planarization layer 144 from a variety of materials such as Spin-On-Glass (SOG), BPSG, PECVD nitride, TEOS, or a low-k dielectric. After deposition of planarization layer 144, a Chemical-Mechanical-Planarization (CMP) step is performed on MOSFET 100 as shown in FIG. 7. Silicon Nitride mask 126 acts as a stop layer for the CMP planarization. The Silicon Nitride Mask also blocks the penetration of deuterium into the source drain regions, 110, 112 in any subsequent process steps involving elevated temperatures. As a result, MOSFET 100 is planarized down to the top portion of Silicon Nitride barrier mask 126 formed over gate stack 102.

Figure 8:
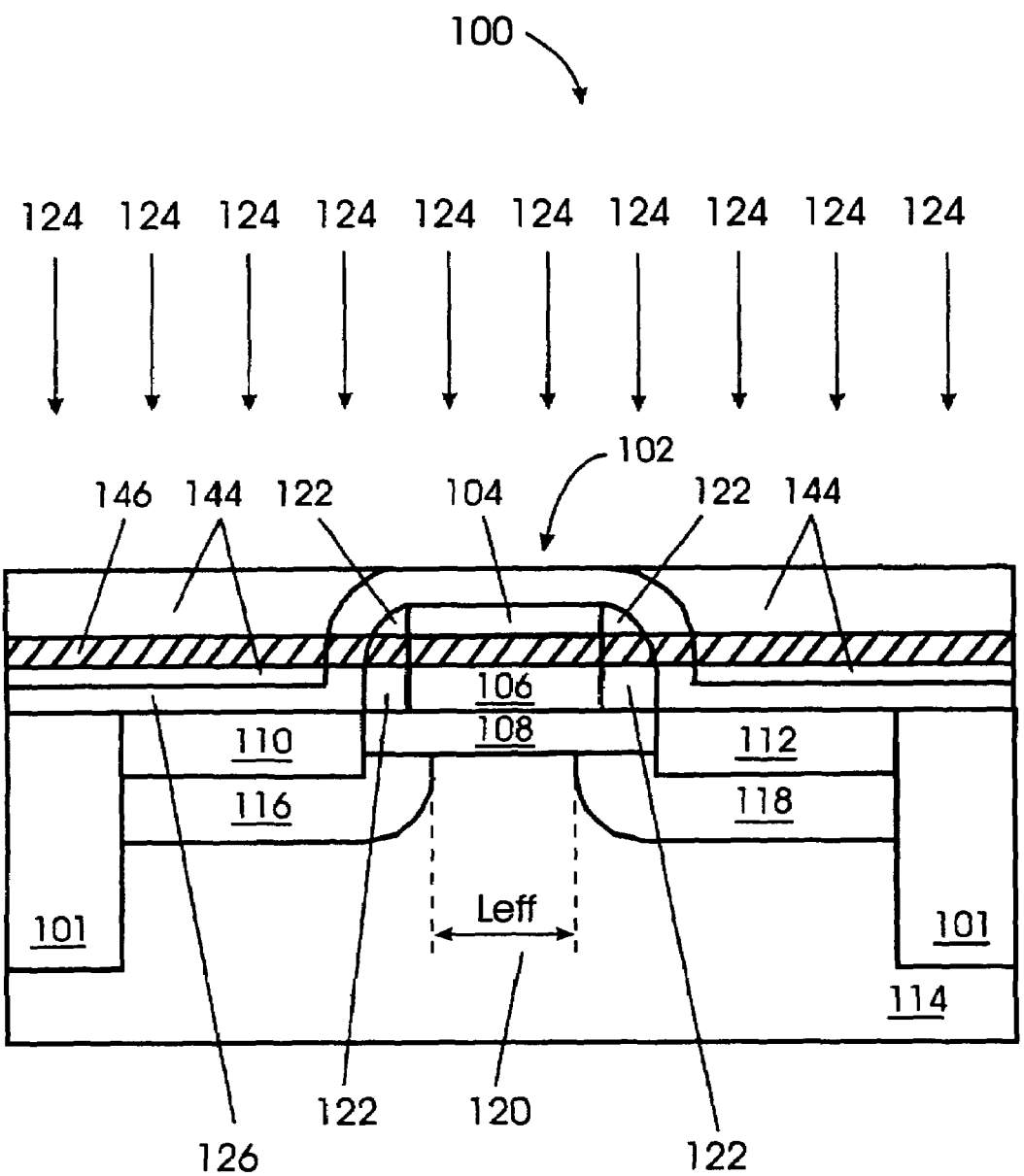

FIG. 8 illustrates ion implantation of deuterium into a gate stack of a MOSFET. An ion implantation process 124 is utilized to perform a blanket implant of deuterium across the wafer supporting MOSFET 100. The energy of ion implantation process 124 is tuned to implant deuterium into poly-silicon gate 106 while not penetrating the silicon nitride barrier 126 over the source drain regions. The dashed region 146 illustrates the region where deuterium penetrates into MOSFET 100 from ion implantation process 124. Deuterium penetrates into poly-silicon gate 106 where it can pacify dangling silicon bonds, but it does not penetrate into source-drain regions 110 and 112 because of the additional path for deuterium ion penetration created by the planarization layer 144 now remaining over the source drain regions after the planarization process. In ion implantation process 124, deuterium ions are implanted through Silicon Nitride barrier mask 126 into gate contact 104 and poly-silicon gate 106. Away from gate stack 102, ion implantation process 124 drives deuterium into planarization layer 144. Planarization layer 144, combined with silicon nitride mask 146, blocks the deuterium ions from penetrating into source-drain regions 110 and 112. Blocking deuterium from reaching source-drain regions 110 and 112 benefits the operation of MOSFET 100 in several ways. For instance, blocking the implantation of deuterium from reaching source-drain regions 110 and 112 preserves the series resistance of source-drain regions 110 and 112. Deuterium, if present in the source drain regions, 110 and 112, essentially causes all the negative effects brought about by the presence of hydrogen in these regions. In addition to the effects of increased series resistance, an increase in junction leakage can also be caused by the presence of either hydrogen or deuterium.

Figure 9:
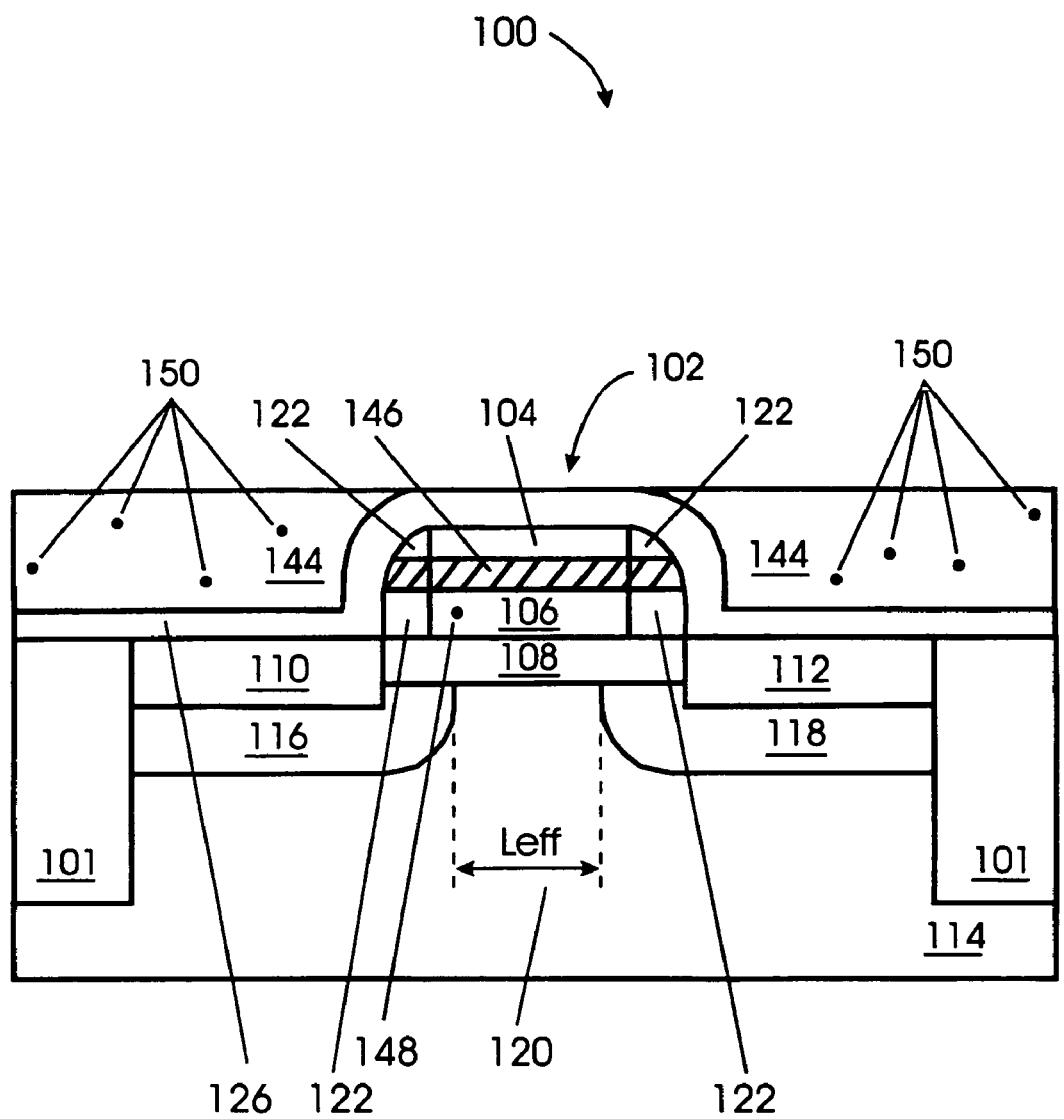

FIG. 9 illustrates diffusion of deuterium through a gate stack with a medium temperature anneal. After implantation of the deuterium, it is desirable to perform an optional thermal anneal process to drive deuterium from gate contact 104 and poly-silicon gate down into the $SiO_2$ gate dielectric 108 to passivate dangling silicon bonds at the Si—$SiO_2$ interface by forming silicon-deuterium bonds. It is desirable to perform the thermal anneal at this stage of fabrication because the MOSFET 100 is depleted of hydrogen from the previous RTA process. As a result of the RTA process, the active region of MOSFET 100 is in a hydrogen-depleted state and is ideal for deuterium activation. Specifically, while in a hydrogen depleted state, a maximum number of dangling silicon bonds are exposed and available for chemically bonding to deuterium. From this RTA process, deuterium 148 diffuses from deuterium rich region 146 down into gate 106 where it bonds with dangling silicon bonds. In addition, any deuterium that has been implanted into the planarization layer 144 that exists over the source drain regions 110 and 112 is prevented from entering such regions by SiN diffusion barrier 126.

Figure 10:
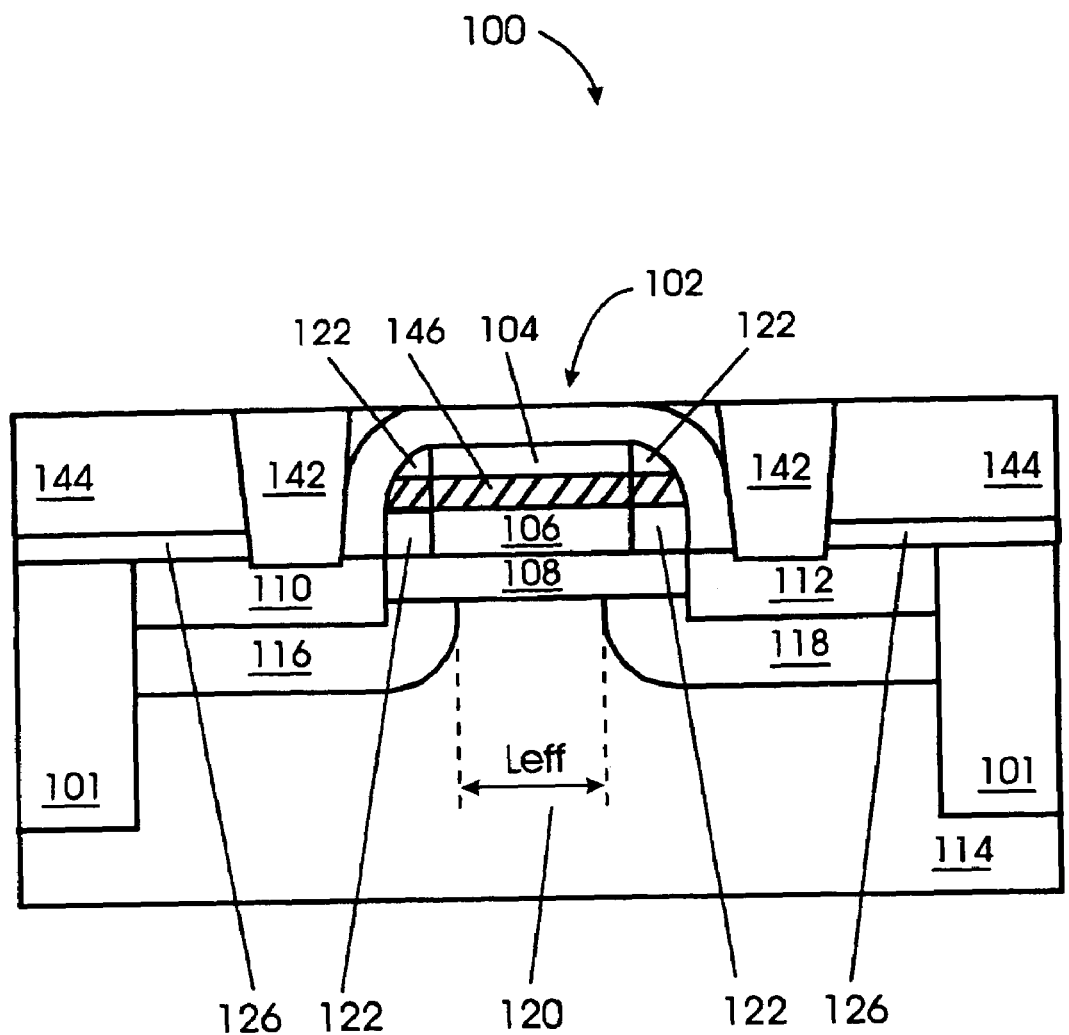

FIG. 10 illustrates formation of deuterium free contacts in a MOSFET having dangling bonds passivated by deuterium within the gate stack. Openings are formed in planarization layer 144 and Silicon Nitride mask 126 in order to fabricate contacts 142 coupled to source drain regions 110 and 112. Contacts 142 are formed through standard Back-End Of the Line (BEOL) metallization flows, commonly with Tungsten. Silicon Nitride barrier mask 126 serves as a planarization stop in the formation of contacts 142.

Figure 11:
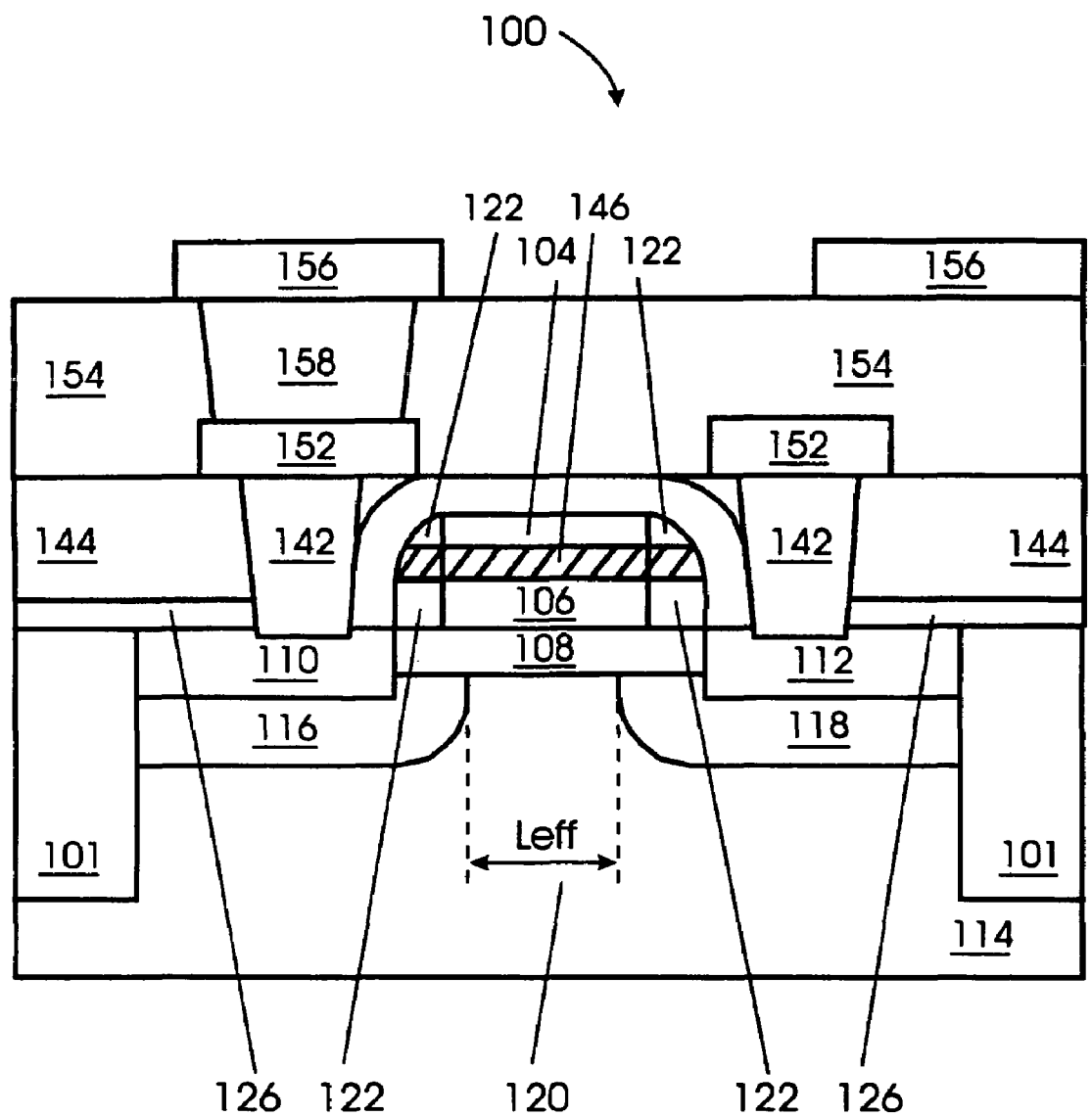

FIG. 11 illustrates a completed MOS structure having two layers of metallization. MOSFET 100 is coupled with contacts to two layers of metallization. A first layer of metallization 152 is deposited over planarization layer 144 coupled to contacts 142. A second planarization layer 154 is deposited over MOSFET 100 to planarize and electrically insulate first metallization layer 152 in preparation for second metallization layer 156. Within second planarzation layer 154, an opening is formed for the fabrication of contact 158. Second metallization layer 154 and contact 158 are planarized and second metallization layer 156 is fabricated, thereby completing the structure.

Figure 12:
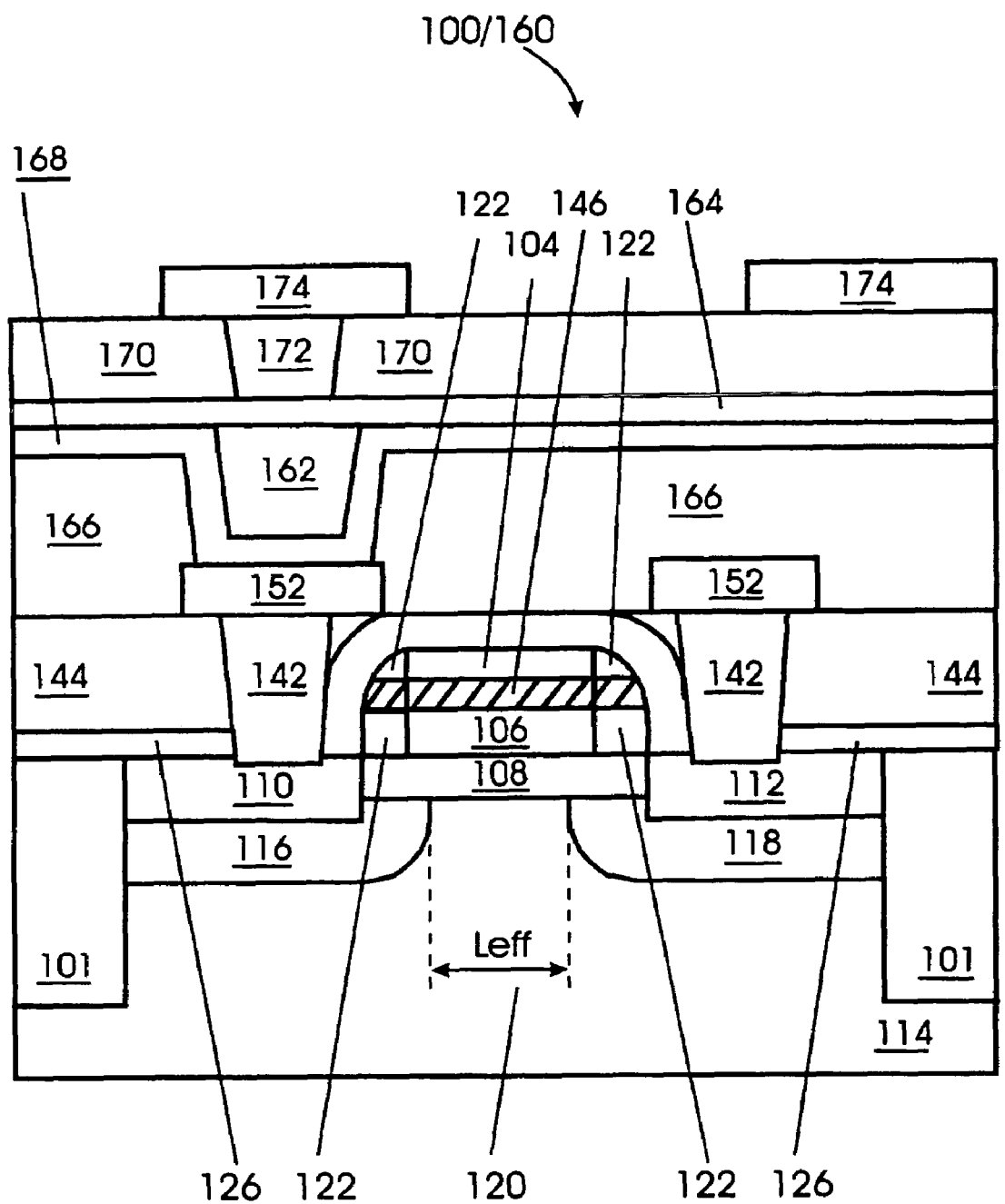
FIG. 12 illustrates a DRAM cell having dangling bonds passivated by deuterium.

FIG. 12 illustrates a DRAM structure having dangling bonds passivated by deuterium. DRAM structure 160 is fabricated over a MOSFET 100 passivated with deuterium. DRAM structure 160 includes a charge storage node 162 coupled to a DRAM cell plate 164, in a top capacitor configuration. A layer of nitride 166 provides structural support and electrical isolation for DRAM structure 160. Storage nodes 162 and DRAM cell plate 164 are formed over a dielectric layer 168. BPSG 170 is deposited over cell plate 164 in which contact 172 is formed. A layer of metallization 174 is fabricated coupled to contact 172. Polysilicon gate 106 is a deuterium rich region. The deuterium implanted into poly-silicon gate 106 diffuses into the active region of MOSFET 100 where it passivates dangling silicon bonds, thereby enhancing the reliability and performance of MOSFET 100.

In the fabrication of DRAM structure 160, it is particularly desirable to limit deuterium implantation into gate stack 102 only and not into source-drain regions 110 and 112. DRAM structures 160 are sensitive to junction leakage. Through driving hydrogen away from the active regions of MOSFET 100 and limiting deuterium implantation into gate stack 102 only, less leakage occurs at the junction contacts. Consequently, implementation of the present invention enhances the reliability and performance of DRAM structures 160. Those skilled in the art will be able to apply the above-described methods to other device configurations, e.g., a deep trench capacitor DRAM cell or other types of memory devices as well as logic and analog devices.

Figure 13:
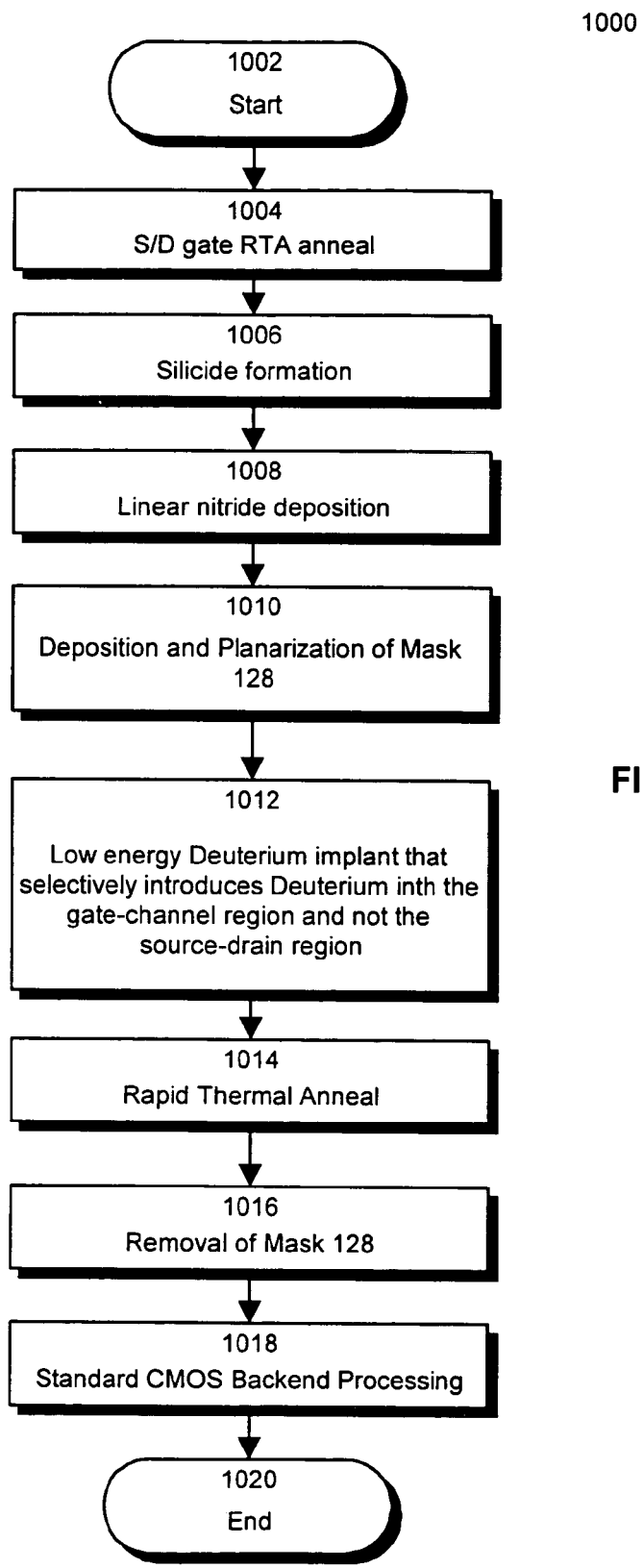
FIG. 13 illustrates a flow chart depicting a method for implementing deuterium passivation as illustrated in FIG. 2.

FIG. 13 illustrates a flow chart 1000 depicting a method for implementing deuterium passivation for CMOS structures and DRAM cells as depicted in FIG. 2. Starting the process in step 1002, the active regions of MOSFET 100, which are source 110, drain 112, channel 120, and gate 102 are processed with a Rapid Thermal Anneal (RTA) in step 1004 to drive all hydrogen out of MOSFET 100. In step 1006, silicides are formed over source region 110, drain region 112, and gate stack 102 to provide for low contact resistance. An LPCVD process is used to deposit Silicon Nitride mask 126 in step 1008. The deposition of Silicon Nitride barrier mask 126 forms a barrier to the diffusion of hydrogen into MOSFET 100. A mask 128, e.g. SOG, BPSG, is deposited over the silicon nitride layer and planarized down to the top of gate stack 102 in step 1010. Subsequently in step 1012, a low energy ion implantation process is used to implant deuterium into MOSFET 100. By varying the energy of the ion implantation process, it is possible to control the penetration depth of the deuterium ions such that they do not penetrate the mask, also referred to as a blocking layer, 128 and the silicon nitride layer 126 lying over the source drain regions, while penetrating to or beyond the bottom of the silicon nitride layer 126 lying over the gate/channel region of the MOSFET. An RTA step 1014 may be used to further drive deuterium into the gate oxide silicon interface. At step 1016, mask 128 is removed by a selective etching step, and a standard backend CMOS processing is performed in step 1018 to complete the fabrication of MOSFET 100 into a CMOS device or DRAM cell. The process ends in step 1020.

Figure 14:
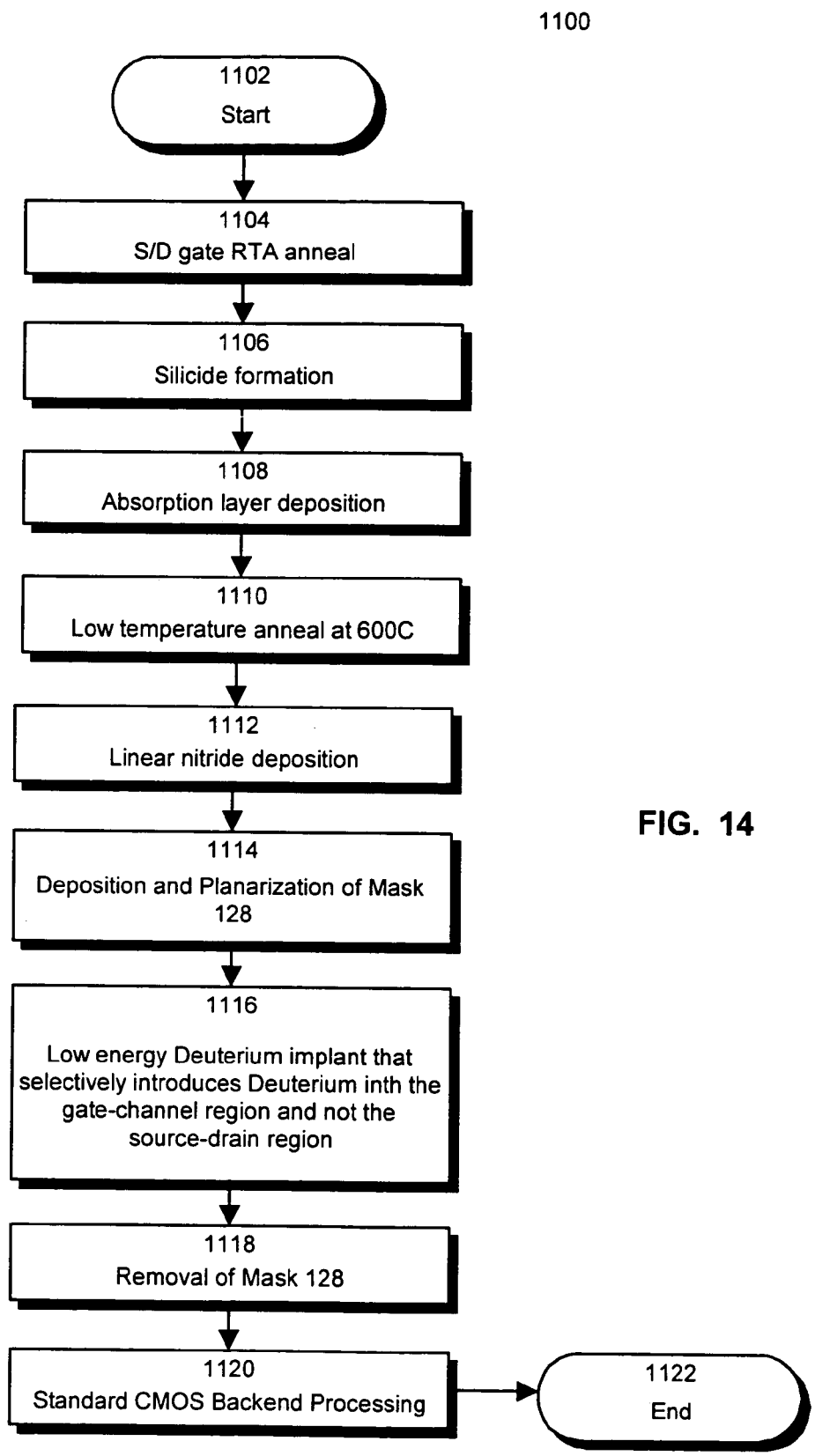
FIG. 14 illustrates a flow chart depicting a method for implementing deuterium passivation with an absorption layer as illustrated in FIG. 3.

FIG. 14 illustrates a flow chart 1100 depicting a method for implementing deuterium passivation with an absorption layer as depicted in FIG. 3. Starting the process in step 1102, the active regions of MOSFET 100, which are source 110, drain 112, channel 120, and gate 102 are processed with a Rapid Thermal Anneal (RTA) in step 1104 to drive all hydrogen out of MOSFET 100. In step 1106, silicides are formed over source region 110, drain region 112, and gate stack 102 for the formation of contacts. Deposition of absorption layer, for example TEOS, BPSG, 132 occurs in step 1108. At this point, a low temperature anneal is performed in step 1110 at around 600 degrees Celsius to drive hydrogen out of absorption layer 132. An LPCVD process is used to deposit Silicon Nitride mask 126 in step 1112. The deposition of Silicon Nitride mask 126 forms a barrier to the diffusion of hydrogen into MOSFET 100 during subsequent process steps. A mask 128 is then deposited onto MOSFET 100 and subsequently planarized down to the top surface of gate stack 102 in step 1114. Subsequently in step 1116, a low energy ion implantation process is used to implant deuterium into MOSFET 100. By varying the energy of the ion implantation process, it is possible to control the penetration depth of the deuterium ions so that deuterium ions penetrate the absorption layer 132 in the gate/channel region 106/108, while not penetrating the absorption layer 132 over the source drain regions because of the blocking layer 128. After deposition of the deuterium ions, mask 128 is removed in step 118. Standard backend CMOS processing is performed in step 1120 to complete the fabrication of MOSFET 100 into a CMOS device or DRAM cell. The process ends in step 1122.

Figure 15:
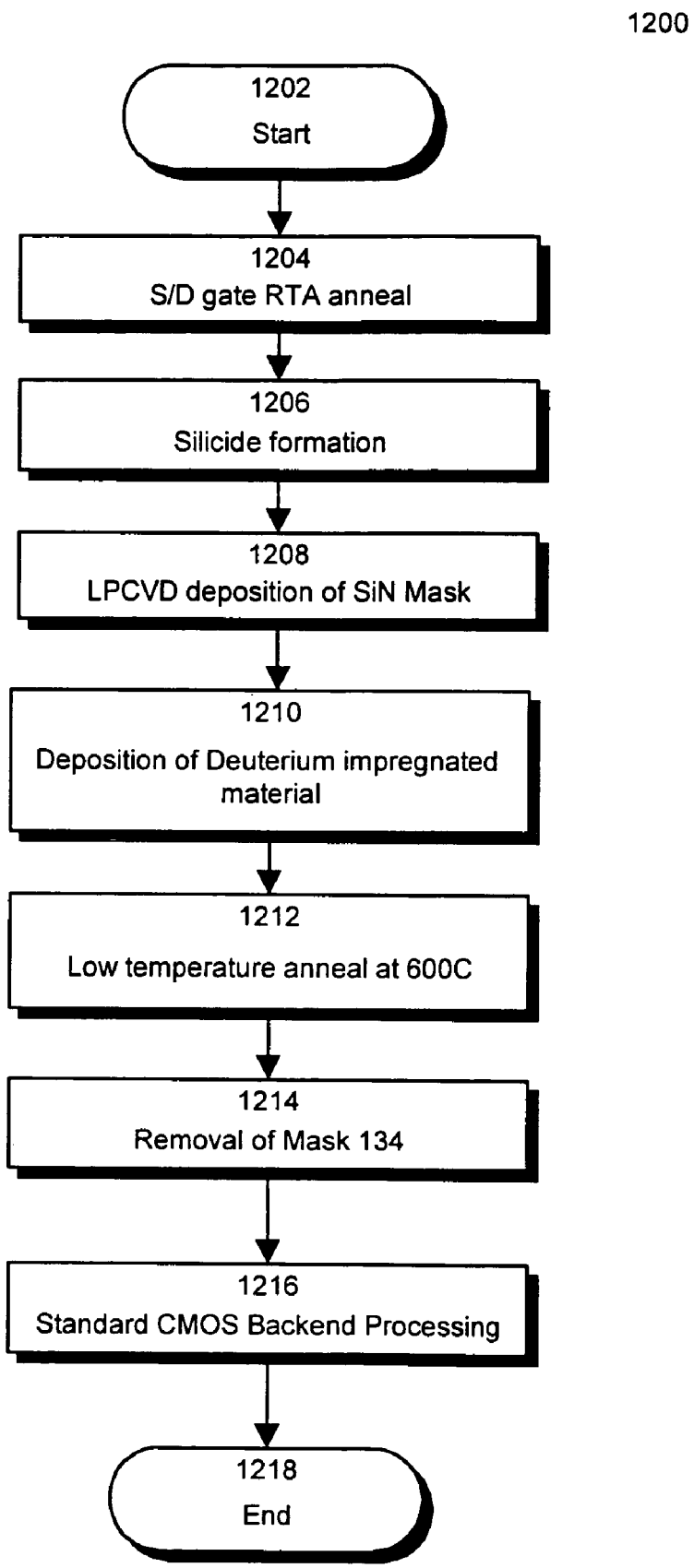
FIG. 15 illustrates a flow chart depicting a method for implementing deuterium passivation by selective use of a Silicon Nitride mask and a solid deuterium rich source as illustrated in FIG. 4.

FIG. 15 illustrates a flow chart 1200 depicting a method for implementing deuterium passivation by selective use of a Silicon Nitride mask and a solid deuterium rich source as depicted in FIG. 4. Starting the process in step 1202, the active regions of MOSFET 100, which are source 110, drain 112, channel 120, and gate 102 are processed with a Rapid Thermal Anneal (RTA) in step 1204 to drive all hydrogen out of MOSFET 100. In step 1206, silicides are formed over source region 110, drain region 112, and gate stack 102 for the formation of contacts. An LPCVD process is used to deposit Silicon Nitride mask 134 in step 1208. The deposition of Silicon Nitride mask 134 forms a barrier to the introduction of deuterium into source-drain regions 110 and 112 into MOSFET 100. Also in step 1208, mask 134 is planarized down to the top surface of gate stack 1202, thereby exposing the top surface of gate stack 102. Subsequently in step 1210, a layer 136 of deuterium impregnated material is deposited over MOSFET 100 on top of gate stack 102. The use of mask 134 prevents the deposition of deuterium-impregnated material from over source drain regions 110 and 112. After the deposition of layer 136 is complete, a subsequent thermal process 1212 drives the deuterium out of the remaining portions of layer 136 into the desired active regions of MOSFET 100 near gate-channel region 102/120. Using masking and etching processes 1214, layer 136 and blocking layer 134 are removed. Standard backend CMOS processing is performed in step 1216 to complete the fabrication of MOSFET 100 into a CMOS device or DRAM cell. The process then is ended in step 1218.

Figure 16:
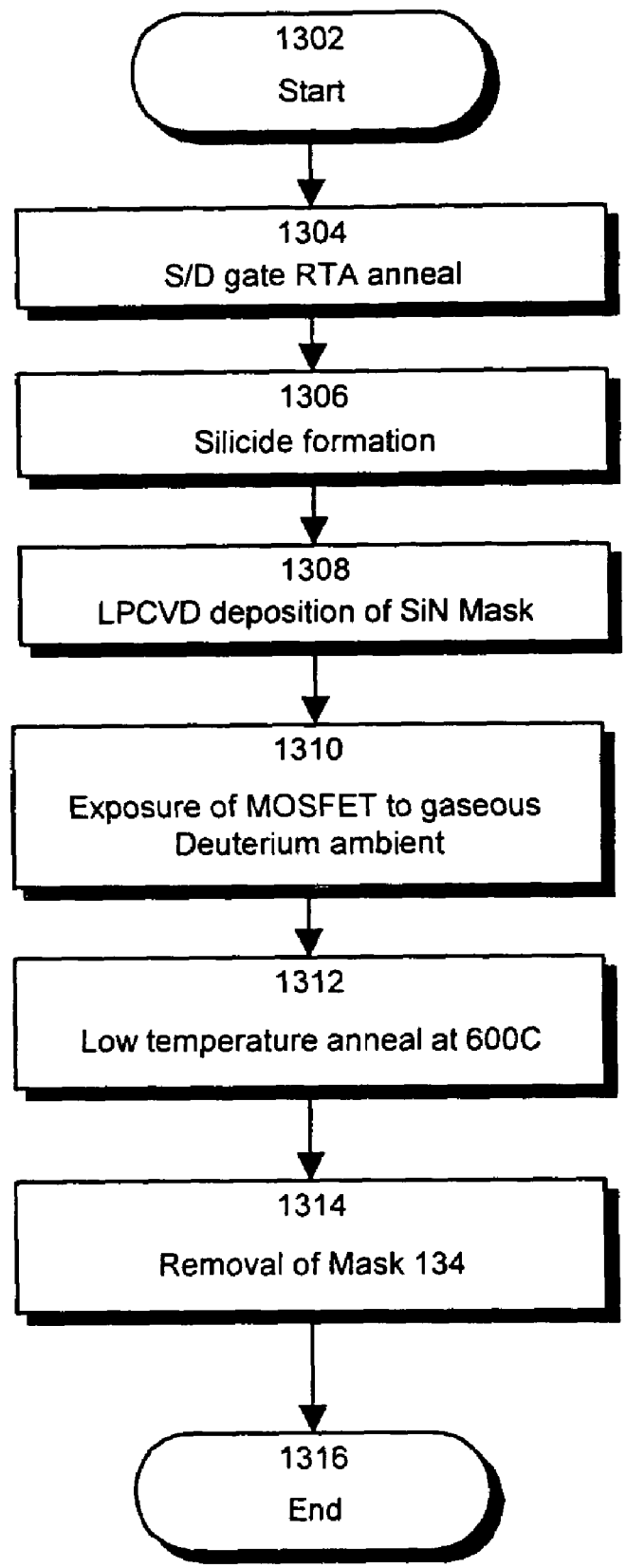
FIG. 16 illustrates an alternative process for selective implantation of deuterium into an MOS device with a gaseous deuterium ambient as illustrated in FIG. 5.

FIG. 16 illustrates a flow chart 1300 depicting an alternative process for selective implantation of deuterium into an MOS device with a gaseous deuterium ambient as illustrated in FIG. 5. Starting the process in step 1302, the active regions of MOSFET 100, which are source 110, drain 112, channel 120, and gate 102 are processed with a Rapid Thermal Anneal (RTA) in step 1304 to drive all hydrogen out of MOSFET 100. In step 1306, silicides are formed over source region 110, drain region 112, and gate stack 102 for the formation of contacts. An LPCVD deposition process, followed by a planarization process, is used to deposit Silicon Nitride mask 134 that leaves gate stack 102 exposed in step 1308. The deposition of Silicon Nitride mask 134 forms a barrier to the diffusion of deuterium into source-drain regions 110 and 112 into MOSFET 100. However, the exposed top surface of gate stack 102 allows for the diffusion of deuterium into gate stack 102. Subsequently in step 1310, MOSFET 100 is exposed to a gaseous deuterium ambient or plasma, at elevated temperatures, allowing deuterium to diffuse into gate stack 102. Next in process step 1312, a thermal process may be used to further drive deuterium through gate stack 102 into gate-channel region 102/120 of MOSFET 100 in order to passivate dangling silicon bonds. After the removal of blocking layer 134 using selective etch steps in step 1314, standard backend CMOS processing is performed to complete the fabrication of MOSFET 100 into a CMOS device or DRAM cell. The process ends in step 1316.

Figure 17:
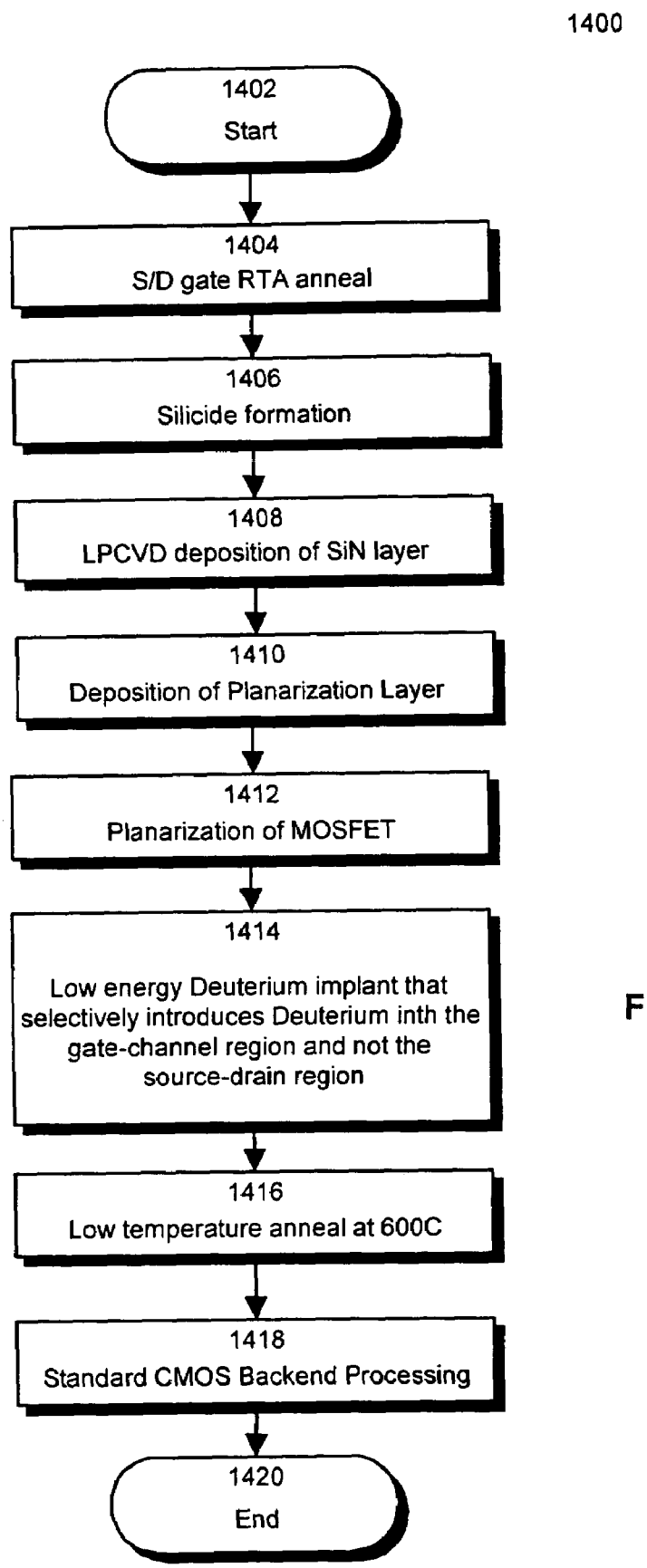
FIG. 17 illustrates an alternative process for selective implantation of deuterium into an MOS device with Spin-On-Glass as illustrated in FIGS. 6–11.

FIG. 17 illustrates a flow chart 1400 an alternative process for selective implantation of deuterium into an MOS device with Spin-On-Glass. Starting the process in step 1402, the active regions of MOSFET 100, which are source 110, drain 112, channel 120, and gate 102 are processed with a Rapid Thermal Anneal (RTA) in step 1404 to drive all hydrogen out of MOSFET 100. In step 1406, silicides are formed over source region 110, drain region 112, and gate stack 102 for the formation of contacts. An LPCVD process is used to deposit Silicon Nitride layer 126 in step 1408. The deposition of Silicon Nitride layer 126 forms a barrier to the diffusion of hydrogen into MOSFET 100. In step 1410, a planarization layer 144 is deposited over MOSFET 100. Planarization layer 144 can be formed from a variety of materials such as Spin-On-Glass (SOG), BPSG, PECVD nitride, TEOS, or a low-k dielectric. After deposition of planarization layer 144, a Chemical-Mechanical-Planarization (CMP) step 1412 is performed on MOSFET 100. In this CMP step 1412, Silicon Nitride mask 126 acts as a stop layer for the CMP planarization. An ion implantation process 124 is utilized in step 1414 to perform a blanket implant of deuterium across the wafer supporting MOSFET 100. Deuterium penetrates into poly-silicon gate 106 (where it can be further driven in by thermal processes to the SiO2—Si interface) in order to pacify dangling silicon bonds, but it does not penetrate into source-drain regions 110 and 112 because of the additional path for deuterium ion penetration created by the planarization layer 144 remaining over the source-drain regions 110 and 112 after the planarization process. In step 1416, a thermal process is used to drive the deuterium through gate stack 102 into gate channel region 102/120 where it passivates dangling silicon bonds. Standard backend CMOS processing is performed in step 1418 to complete the fabrication of MOSFET 100 into a CMOS device or DRAM cell. The process then ends in step 1420.

These processes for selectively and strategically passivating dangling silicon bonds with deuterium in gate-channel region 102/120 as illustrated in FIGS. 1–17 are compatible with dual damascene processes used to fabricate copper interconnect lines, as well as conventional processes used to fabricate aluminum interconnect lines.

Although the present invention has been described in detail, it will be apparent to those of skill in the art that the invention may be embodied in a variety of specific forms and that various changes, substitutions, and alterations can be made without departing from the spirit and scope of the invention. The described embodiments are only illustrative and not restrictive and the scope of the invention is, therefore, indicated by the following claims.

We claim:

1. A process for selectively passivating dangling silicon bonds at the SiO2—Si interface in the channel region of a MOSFET device with deuterium, comprising the steps of:
   performing a thermal anneal to drive hydrogen out of active regions of a MOSFET;
   depositing a nitride layer over said MOSFET;
   selectively placing deuterium into a gate-channel region of said MOSFET without placing said deuterium into a source-drain region of said MOSFET; and
   passivating a dangling silicon bond present in said gate-channel region with said deuterium.

2. The process of claim 1, further comprising the steps of:
   creating a deuterium absorption layer between said nitride layer and said MOSFET, wherein said deuterium absorption layer absorbs a higher concentration of said deuterium than said nitride layer; and implanting said deuterium into said deuterium absorption layer, thereby creating a deuterium rich source for passivating said dangling silicon bond.

3. The process of claim 1, further comprising the steps of:
selectively removing a portion of said nitride layer from said MOSFET above said source-drain region, thereby defining a window in said nitride layer;
depositing a material containing deuterium into said window; and
driving said deuterium out of said material into said gate-channel region of said MOSFET with a thermal process.

4. The process of claim 1, further comprising the steps of:
depositing a planarization layer over said nitride layer; and
implanting deuterium through said nitride layer into said MOSFET at a layer above said source-drain region.

5. The process of claim 4, further comprising a step of thermally driving said deuterium toward said dangling silicon bond in said gate-channel region.

6. The process of claim 1, further comprising a step of processing to fabricate said MOSFET into a CMOS device.

7. The process of claim 1, further comprising a step of processing to fabricate said MOSFET into a DRAM cell.

8. The process of claim 1, wherein deuterium is selectively placed into said gate-channel region prior to the formation of a planarization layer that supports a layer of interconnect.

9. The process of claim 1, further comprising a step of depositing a mask over said source-drain region.

10. The process of claim 1, further comprising the steps of:
depositing a mask over said MOSFET, said mask covers said source-drain region and not said gate-channel region; and
exposing said MOSFET to a gaseous deuterium ambient prior to deposition of said nitride layer.

11. The process of claim 1 further comprising the steps of:
depositing a mask over said MOSFET, said mask covers said source-drain region and not said gate-channel region; and
exposing said MOSFET to a plasma ambient containing deuterium prior to deposition of said nitride layer.

12. A process for pacifying dangling silicon bonds, comprising the steps of:
driving hydrogen out of a MOSFET with a thermal process;
depositing a mask over a source-drain region of said MOSFET;
introducing a material containing deuterium over a gate stack on said MOSFET, thereby forming a deuterium source;
thermally driving deuterium out of said material into a gate-channel region of said MOSFET; and
forming silicon-deuterium bonds in said gate-channel region, thereby passivating said dangling silicon bonds.

13. The process of claim 12, further comprising a step of blocking out diffusion of said deuterium from said gate-channel region with a nitride layer formed over said MOSFET.

14. The process of claim 12, wherein said material is formed from deuterated silane.

15. The process of claim 12, wherein said mask is formed of nitride.

16. The process of claim 12, further comprising a step of forming interconnects to fabricate a CMOS device.

17. The process of claim 12, further comprising a step of fabricating a DRAM cell coupled to said MOSFET.

18. A process for reducing instabilities caused by hot carriers in an MOS device, comprising the steps of:
removing hydrogen from active regions of an MOS device with a thermal process, thereby maximizing an amount of dangling silicon bonds available for bonding in said MOS device;
covering said MOS device with a nitride barrier layer, thereby blocking hydrogen from diffusing back into said MOS device;
depositing a planarization layer over said nitride barrier layer;
implanting deuterium through said nitride barrier mask into said MOS device at a layer above a source drain region; and
forming silicon-deuterium bonds in a gate-channel region of said MOS device without introducing deuterium into said source drain region.

19. The process of claim 18, wherein said layer is a bottom portion of said nitride barrier layer.

20. The process of claim 18, further comprising a step of thermally driving said deuterium toward said gate-channel region.

21. The process of claim 18, wherein said layer is within a gate stack of said MOS device.

22. The process of claim 18, wherein said layer is a deuterium absorption layer formed between said nitride barrier layer and said MOS device, wherein said deuterium absorption layer absorbs a higher concentration of said deuterium than said nitride barrier layer.

23. A process for selectively passivating dangling silicon bonds at the SiO2—Si interface in the channel region of a MOSFET device with deuterium, comprising the steps of:
performing a thermal anneal to drive hydrogen out of active regions of a MOSFET;
depositing a nitride layer over said MOSFET;
selectively placing deuterium into a gate-channel region of said MOSFET without placing said deuterium into a source-drain region of said MOSFET;
passivating a dangling silicon bond present in said gate-channel region with said deuterium; and
performing backend of the line processing after passivating said dangling silicon bond.

24. The process of claim 23, wherein said backend of the line processing includes the step of depositing a planarization layer over said MOSFET.

25. The process of claim of claim 23, wherein said backend of the line processing includes the step of forming interconnect.

* * * * *

UNITED STATES PATENT AND TRADEMARK OFFICE
CERTIFICATE OF CORRECTION

PATENT NO.       : 7,087,507 B2                                          Page 1 of 1
APPLICATION NO.  : 10/847538
DATED            : August 8, 2006
INVENTOR(S)      : Viktor Koldiaev et al.

It is certified that error appears in the above-identified patent and that said Letters Patent is hereby corrected as shown below:

On the title page item (75), under "Inventors," change "Jeff Babock" to --Jeff A. Babcock--.

Signed and Sealed this

Twenty-first Day of November, 2006

JON W. DUDAS
*Director of the United States Patent and Trademark Office*